US012628541B2

(12) United States Patent
Kim et al.

(10) Patent No.: US 12,628,541 B2
(45) Date of Patent: May 12, 2026

(54) DISPLAY DEVICE

(71) Applicant: Samsung Display Co., Ltd., Yongin-si (KR)

(72) Inventors: Jang-Il Kim, Yongin-si (KR); Jeongki Kim, Yongin-si (KR); Hyejun Woo, Yongin-si (KR); Seongyeon Lee, Yongin-si (KR); Sujin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 357 days.

(21) Appl. No.: 18/455,360

(22) Filed: Aug. 24, 2023

(65) Prior Publication Data

US 2024/0099112 A1 Mar. 21, 2024

(30) Foreign Application Priority Data

Sep. 21, 2022 (KR) ........................ 10-2022-0119577

(51) Int. Cl.
*H10K 59/80* (2023.01)
*H10K 59/12* (2023.01)
*H10K 59/38* (2023.01)

(52) U.S. Cl.
CPC ......... *H10K 59/8792* (2023.02); *H10K 59/38* (2023.02); *H10K 59/12* (2023.02)

(58) Field of Classification Search
CPC ..... H10K 59/8792; H10K 59/38; H10K 59/12
See application file for complete search history.

(56) References Cited

U.S. PATENT DOCUMENTS

| | | | |
|---|---|---|---|
| 8,044,575 B2 | 10/2011 | Kawamura | |
| 10,985,208 B2 | 4/2021 | Park et al. | |
| 11,641,008 B2 | 5/2023 | Lee et al. | |
| 2015/0162386 A1* | 6/2015 | Furuie | H10K 59/351 257/40 |
| 2016/0133675 A1* | 5/2016 | Yata | H10K 59/351 257/89 |
| 2018/0151842 A1* | 5/2018 | Park | H10K 59/8792 |

(Continued)

FOREIGN PATENT DOCUMENTS

| | | |
|---|---|---|
| JP | 2010-33905 A | 2/2010 |
| KR | 10-2019-0038365 A | 4/2019 |

(Continued)

*Primary Examiner* — Mary Ellen Bowman
(74) *Attorney, Agent, or Firm* — Womble Bond Dickinson (US) LLP

(57) ABSTRACT

A display device includes: a display panel having first and second emission regions, each of the first and second emission regions configured to emit a first source light having a first color and a second source light having a second color; a first partition wall on the display panel and corresponding to the first emission region; a sub-partition wall dividing a region inside the first partition wall into a main region and a sub region in a plane view; a first light conversion pattern inside the main region, the first light conversion pattern configured to convert the first source light into a light having the second color; and a first color filter on the first partition wall and the sub-partition wall, the first color filter being transparent to the second source light that passes through the sub region and to the converted light having the second color.

20 Claims, 18 Drawing Sheets

(56)         References Cited

U.S. PATENT DOCUMENTS

| | | | | |
|---|---|---|---|---|
| 2022/0246684 A1* | 8/2022 | Kim | ........................ | H10K 59/38 |
| 2023/0217768 A1* | 7/2023 | Kim | .................. | H10K 59/1216 |
| | | | | 257/40 |
| 2023/0284512 A1* | 9/2023 | Kim | .................... | H10K 59/122 |
| | | | | 257/91 |

FOREIGN PATENT DOCUMENTS

| | | | |
|---|---|---|---|
| KR | 10-2020-0022575 A | 3/2020 |
| KR | 10-2022-0014426 A | 2/2022 |
| KR | 10-2022-0110409 A | 8/2022 |

\* cited by examiner

EMLb

EM3a

CGLb

EM2a

CGLa

EM1a

DR3

DR2 DR1

DISPLAY DEVICE

CROSS-REFERENCE TO RELATED APPLICATION

This application claims priority to and the benefit of Korean Patent Application No. 10-2022-0119577, filed on Sep. 21, 2022, in the Korean Intellectual Property Office, the entire disclosure of which is incorporated herein by reference.

BACKGROUND

1. Field

Aspects of embodiments of the present disclosure relate to a display device.

2. Description of the Related Art

A display device may be classified as a transmissive display device that selectively allows source light to pass therethrough or an emissive display device that generates source light itself. A display device may include different types of functional patterns depending on pixels to create images. A functional pattern may transmit a partial wavelength range of source light or may change a color of source light.

SUMMARY

An embodiment of the present disclosure provides a display device with increased light emission efficiency.

According to an embodiment of the present disclosure, a display device includes: a display panel having a first emission region and a second emission region, each of the first emission region and the second emission region configured to emit a first source light having a first color and a second source light having a second color; a first partition wall on the display panel, the first partition wall corresponding to the first emission region; a sub-partition wall dividing a region inside the first partition wall into a main region and a sub region in a plane view; a first light conversion pattern inside the main region, the first light conversion pattern configured to convert the first source light into a light having the second color; and a first color filter on the first partition wall and the sub-partition wall, the first color filter being transparent to the second source light that passes through the sub region and to the converted light having the second color.

The sub region may include a corner area of the region inside the first partition wall.

The sub region may completely surround the main region in the plane view.

An area of the main region may be greater than an area of the sub region.

The first light conversion pattern may include a base resin and a quantum dot mixed in the base resin.

The display device may further include a transparent organic material inside the sub region.

The display device may further include a scattering particle inside the sub region and mixed in the transparent organic material.

The first color may be blue light, and the second color may be green light.

The first color filter may overlap the main region and the sub region in the plane view.

The display device may further include: a second partition wall on the display panel, the second partition wall corresponding to the second emission region; a second light conversion pattern inside the second partition wall, the second light conversion pattern configured to convert the first source light into a light having a third color; and a second color filter on the second partition wall, the second color filter being opaque to the second source light that passes through the second light conversion pattern and transparent to the converted light having the third color.

The display device may further include: a second partition wall on the display panel, the second partition wall corresponding to the second emission region; a transparent resin pattern inside the second partition wall, the transparent resin pattern being transparent to the first source light and the second source light; and a second color filter on the second partition wall, the second color filter being opaque to the second source light that passes through the transparent resin pattern and transparent to the first source light that passes through the transparent resin pattern.

The transparent resin pattern may include a base resin and a scattering particle mixed in the base resin.

The display device may further include a base layer facing the display panel in a thickness direction of the display panel. The first color filter may be on a bottom surface of the base layer, and the first partition wall and the sub-partition wall may be on a bottom surface of the first color filter.

The display panel may include: a first anode in the first emission region; a second anode in the second emission region and spaced apart from the first anode; an emission structure on the first anode and the second anode, the emission structure extending through the first emission region and the second emission region; and a cathode on the emission structure, the cathode extending through the first emission region and the second emission region.

The emission structure may include: a first emission layer configured to generate the first source light; a second emission layer configured to generate the second source light; and a charge generation layer between the first emission layer and the second emission layer.

The display device may further include: a main dummy partition wall defining a main well that does not overlap the first emission region and the second emission region in the plane view; and a sub-dummy partition wall extending between the main dummy partition wall and the first partition wall and defining a subordinate well.

According to an embodiment of the present disclosure, a display device includes: a display panel including a first light emitting element and a second emitting element, each of the first emitting element and the second emitting element configured to emit a first source light having a first color and a second source light having a second color; and a light conversion panel spaced apart from the display panel in a thickness direction of the display panel. The light conversion panel includes: a base layer; a partition wall on a bottom surface of the base layer, the partition wall corresponding to the first light emitting element; a sub-partition wall dividing a region inside the partition wall into a main region and a sub region in a plane view; a light conversion pattern inside the main region, the light conversion pattern configured to convert the first source light into a light having the second color; and a color filter between the light conversion pattern and the bottom surface of the base layer, the color filter being transparent to the second source light that passes through the sub region and to the converted light having the second color.

The display device may further include a synthetic resin material between the display panel and the light conversion panel. The synthetic resin material may be inside the sub region.

According to an embodiment of the present disclosure, a display device includes: a first light emitting element and a second light emitting element, each of the first light emitting element and the second light emitting element configured to emit a first source light having a first color and a second source light having a second color; a thin encapsulation layer encapsulating the first light emitting element and the second light emitting element; a partition wall on the thin encapsulation layer, the partition wall corresponding to the first light emitting element; a sub-partition wall dividing a region inside the partition wall into a main region and sub region in a plane view; a light conversion pattern inside the main region, the light conversion pattern configured to convert the first source light into a light having the second color; and a color filter on the partition wall and the sub-partition wall, the color filter being transparent to the second source light that passes through the sub region and to the converted light having the second color.

The display device may further include: a transparent organic material inside the sub region; and a scattering particle mixed in the transparent organic material.

DETAIL PARTED DESCRIPTION

Figures 1A, 1B:
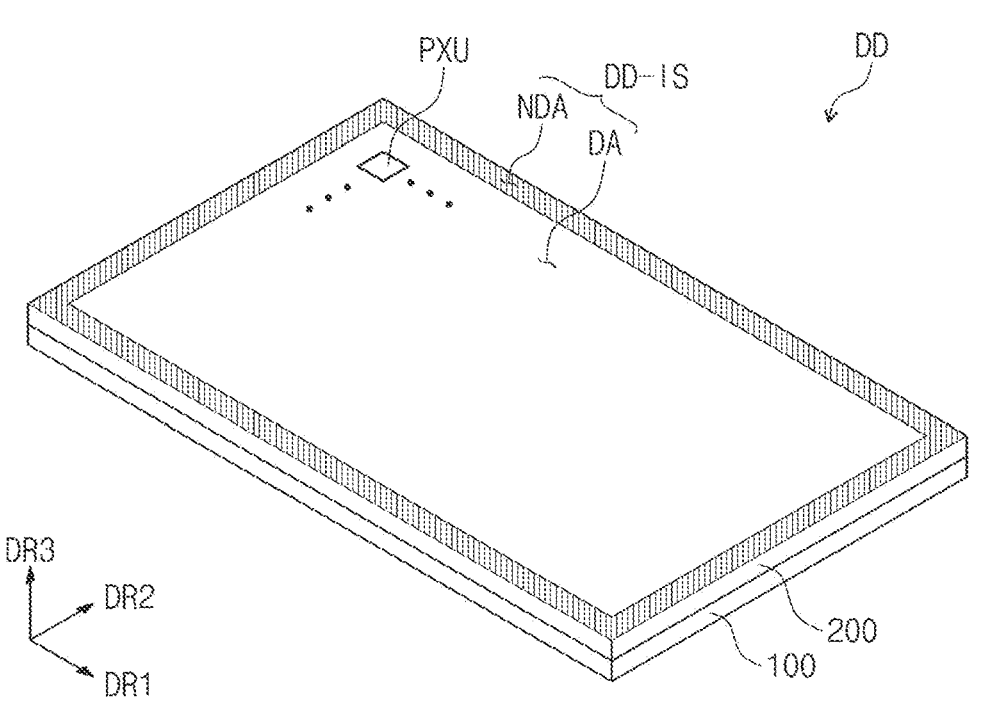
FIG. 1A illustrates a perspective view showing a display device according to an embodiment of the present disclosure.
FIG. 1B illustrates a cross-sectional view showing a display device according to an embodiment of the present disclosure.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure."

Expressions, such as "at least one of" and "any one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Unless otherwise defined, all terms used herein including technical and scientific terms have the same meaning generally understood by one of ordinary skilled in the art. Also, terms as defined in dictionaries generally used should be understood as having meaning identical or meaning contextually defined in the art and should not be understood as ideally or excessively formal meaning unless definitely defined herein.

Hereinafter, some embodiments of the present disclosure will be described in conjunction with the accompanying drawings.

Figure 1C:
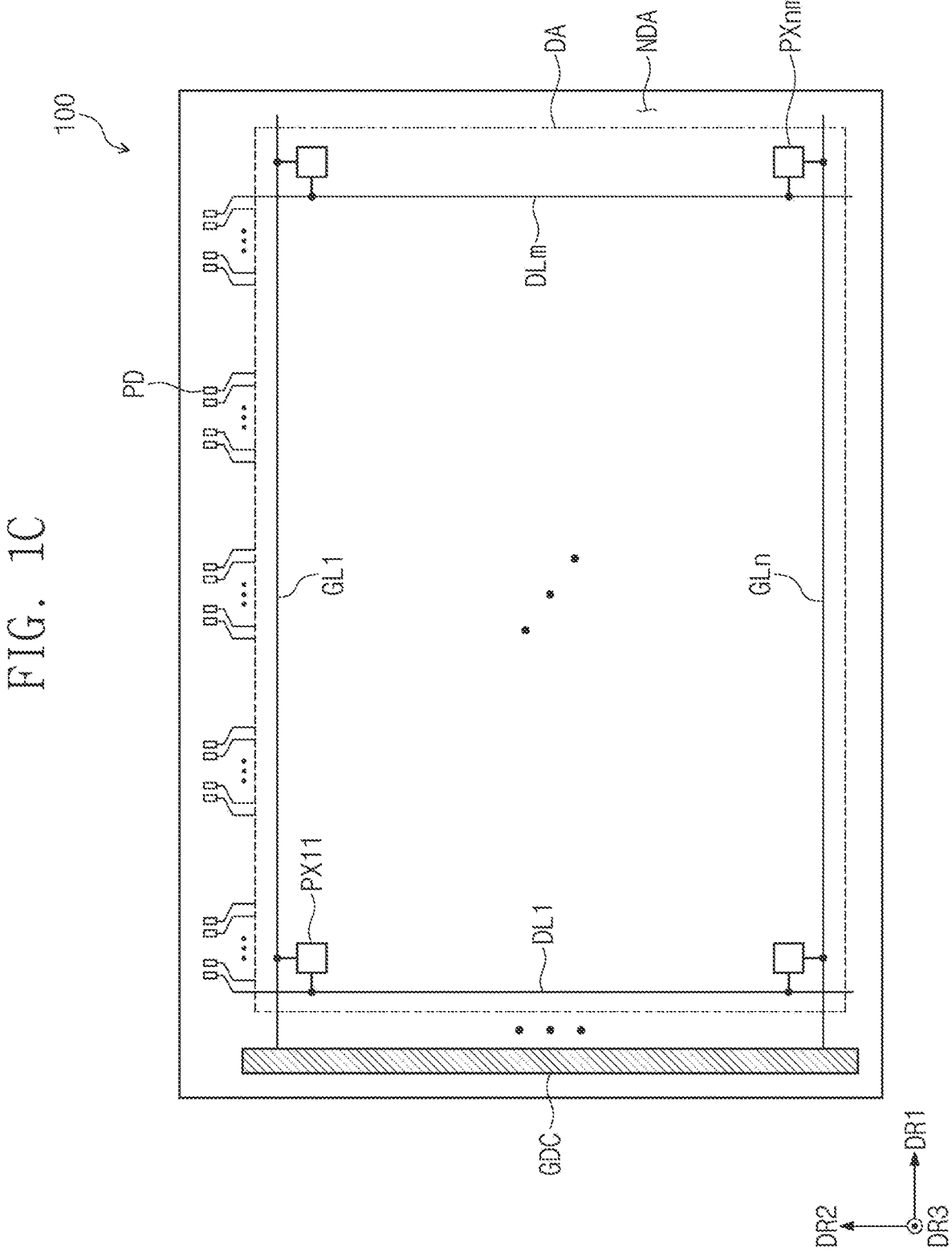
FIG. 1C illustrates a plane view showing a display panel according to an embodiment of the present disclosure.

FIG. 1A illustrates a perspective view showing a display device DD according to an embodiment of the present disclosure. FIG. 1B illustrates a cross-sectional view of the display device DD according to an embodiment of the present disclosure. FIG. 1C illustrates a plane view showing a display panel 100 according to an embodiment of the present disclosure.

Referring to FIG. 1A, the display device DD may display (or may be configured to display) an image on a display surface DD-IS. The display surface DD-IS may be parallel to a plane defined by a first direction DR1 and a second direction DR2. The display surface DD-IS may indicate or refer to a top surface of a member disposed at an uppermost side of the display device DD.

A third direction DR3 may refer to a normal direction with respect to the display surface DD-IS and/or may refer to a thickness direction of the display device DD. The third direction DR3 may differentiate front and rear surfaces (or top and bottom surfaces) of each layer, component, or unit, which will be discussed below.

The display device DD (e.g., the display surface DD-IS) may have a display region DA and a non-display region NDA. Unit pixels PXU may be disposed in the display region DA but not in the non-display region NDA. The non-display region NDA may be defined along a border of (or a periphery of) the display surface DD-IS. The non-display region NDA may surround the display region DA (e.g., may surround the display region DA in a plane view). In an embodiment of the present disclosure, the non-display region NDA may be omitted or disposed on only one side of the display region DA. FIG. 1A depicts, by way of example, a flat display device DD, but the display device DD may have a curved shape or may be rollable or slidable from a housing.

The unit pixels PXU illustrated in FIG. 1A may define (or may be arranged in) pixel rows and pixel columns. The unit pixel PXU may be a minimum repeating unit and may include at least one pixel. The unit pixel PXU may include a plurality of pixels that provide different color light beams.

Referring to FIG. 1B, the display device DD may include a display panel 100 (or lower display substrate) and a light conversion panel 200 (or upper display substrate) that face each other while being spaced apart from each other. A cell gap may be formed between the display panel 100 and the light conversion panel 200. The cell gap may be maintained by a sealing member SLM that couples the display panel 100 and the light conversion panel 200 to each other. The sealing member SLM may include a binder resin and inorganic fillers mixed in the binder resin. The sealing member SLM may include other additive(s). The additive may include an amine-based hardener and a photoinitiator. The additive may further include a silane-based additive and an acrylic-based additive. The sealing member SLM may include an inorganic material, such as a frit.

Referring still to FIG. 1B, as the display region DA and the non-display region NDA may be defined in the display device DD, a display region DA and a non-display region NDA may be defined in each of the display panel 100 and the light conversion panel 200. In the following description, the display region DA of the display device DD may denote the display region DA of each of the display panel 100 and the light conversion panel 200, and the non-display region NDA of the display device DD may denote the non-display region NDA of each of the display panel 100 and the light conversion panel 200.

FIG. 1C shows a planar arrangement relation between signal lines GL1 to GLn and DL1 to DLm and pixels PX11 to PXnm. The signal lines GL1 to GLn and DL1 to DLm may include a plurality of gate lines GL1 to GLn and a plurality of data lines DL1 to DLm.

Each of the pixels PX11 to PXnm may be connected to a corresponding one of the plurality of gate lines GL1 to GLn and to a corresponding one of the plurality of data lines DL1 to DLm. Each of the pixels PX11 to PXnm may include a pixel driver circuit and a light emitting element. Based on a configuration of the pixel driver circuit of the pixels PX11 to PXnm, the display panel 100 may further include various kinds of signal lines.

A gate driver circuit GDC may be integrated on the display panel 100 through an oxide silicon gate driver circuit (OSG) process or an amorphous silicon gate driver circuit (ASG) process. The gate driver circuit GDC is connected to the gate lines GL1 to GLn and may be disposed on one side of the non-display region NDA in the first direction DR1. A plurality of pads PD connected to distal ends of the data lines DL1 to DLm may be disposed on one side of the non-display region NDA in the second direction DR2.

Figure 2:
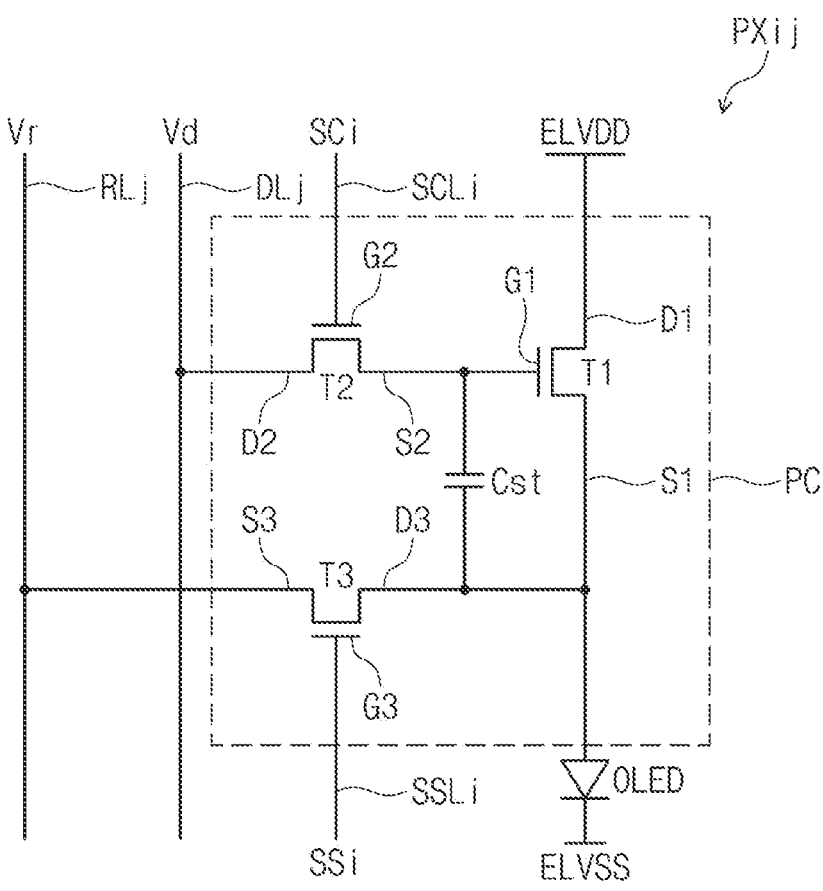
FIG. 2 illustrates an equivalent circuit diagram of a pixel according to an embodiment of the present disclosure.

FIG. 2 illustrates an equivalent circuit diagram of a pixel PXij according to an embodiment of the present disclosure. FIG. 2 depicts, by way of example, the pixel PXij connected to an $i^{th}$ scan line SCLi, an $i^{th}$ sensing line SSLi, a $j^{th}$ data line DLL and a $j^{th}$ reference line RLj. The pixel PXij may include a pixel circuit PC and a light emitting element OLED connected to the pixel circuit PC. The pixel circuit PC may include a plurality of transistors T1 to T3 and a capacitor Cst. The plurality of transistors T1 to T3 may be formed through a low temperature polycrystalline silicon (LTPS) process or a low temperature polycrystalline oxide (LTPO) process. In the following embodiment, the plurality of transistors T1 to T3 are described as being n-type transistors, but at least one of the transistors T1 to T3 may be implemented as a p-type transistor.

In the illustrated embodiment, a pixel circuit PC including a first transistor T1 (e.g., driver transistor), a second transistor T2 (e.g., switch transistor), a third transistor T3 (e.g., sensing transistor), and a capacitor Cst is shown, but the pixel circuit PC is not necessarily limited thereto. The pixel circuit PC may further include an additional transistor(s) or an additional capacitor(s).

The light emitting element OLED may be an organic or inorganic light emitting device including an anode (or first electrode) or a cathode (or second electrode). The anode of the light emitting element OLED may receive a first voltage ELVDD through the first transistor T1, and the cathode of the light emitting element OLED may receive a second voltage ELVSS. The light emitting element OLED may receive the first voltage ELVDD and the second voltage ELVSS, thereby emitting light.

The first transistor T1 may include a drain D1 that receives the first voltage ELVDD, a source S1 connected to the anode of the light emitting element OLED, and a gate G1 connected to the capacitor Cst. The first transistor T1 may control a drive current that flows from the first voltage ELVDD toward the light emitting element OLED in accordance with a voltage value stored in the capacitor Cst.

The second transistor T2 may include a drain D2 connected to the $j^{th}$ data line DLj, a source S2 connected to the capacitor Cst, and a gate G2 that receives an $i^{th}$ first scan signal SCi. The $j^{th}$ data line DLj may receive a data voltage Vd. In response to the $i^{th}$ first scan signal SCi, the second transistor T2 may provide the first transistor T1 with the data voltage Vd.

The third transistor T3 may include a source S3 connected to the $j^{th}$ reference line RLj, a drain D3 connected to the anode of the light emitting element OLED, and a gate G3 that receives an $i^{th}$ second scan signal SSi. The $j^{th}$ reference line RLj may receive a reference voltage Vr. The third transistor T3 may initialize the capacitor Cst and the anode of the light emitting element OLED.

The capacitor Cst may store a voltage that corresponds to a difference between the first voltage ELVDD and a voltage received from the second transistor T2. The capacitor Cst may be connected to the gate G1 of the first transistor T1 and the anode of the light emitting element OLED.

Figure 3A:
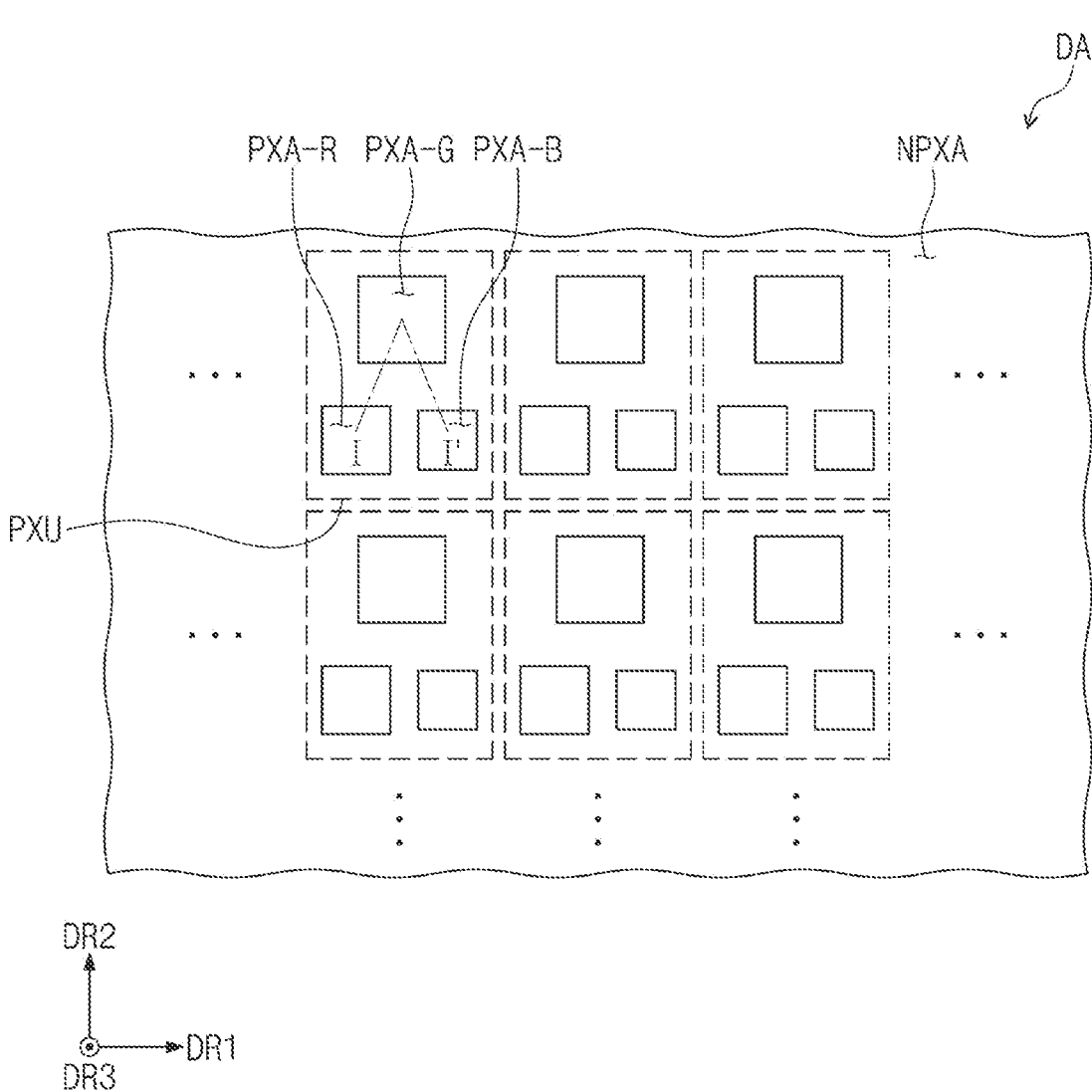
FIG. 3A illustrates an enlarged plane view showing a display region according to an embodiment of the present disclosure.
Figure 3B:
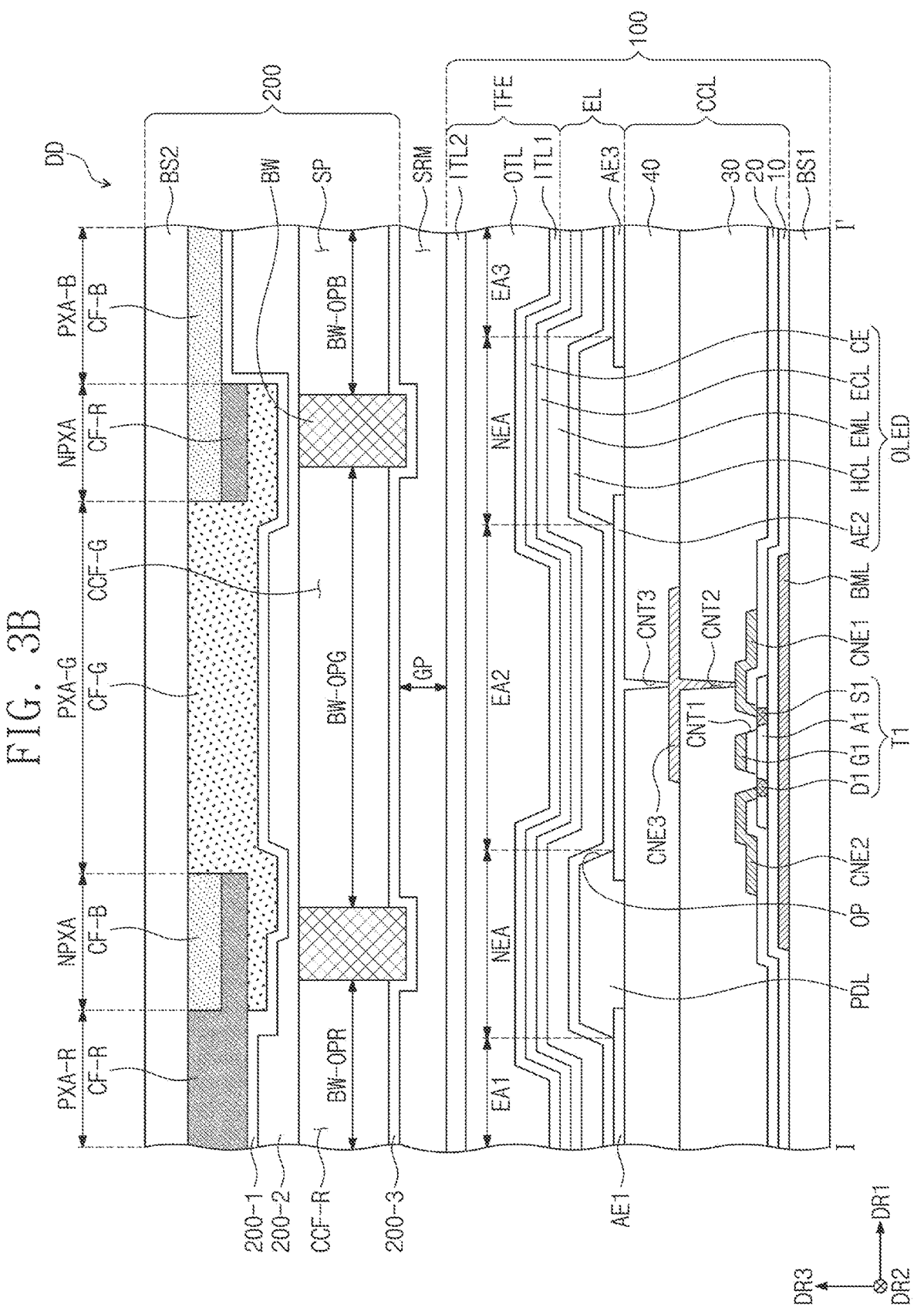
FIG. 3B illustrates a cross-sectional view taken along the line I-I' in FIG. 3A.
Figure 3C:
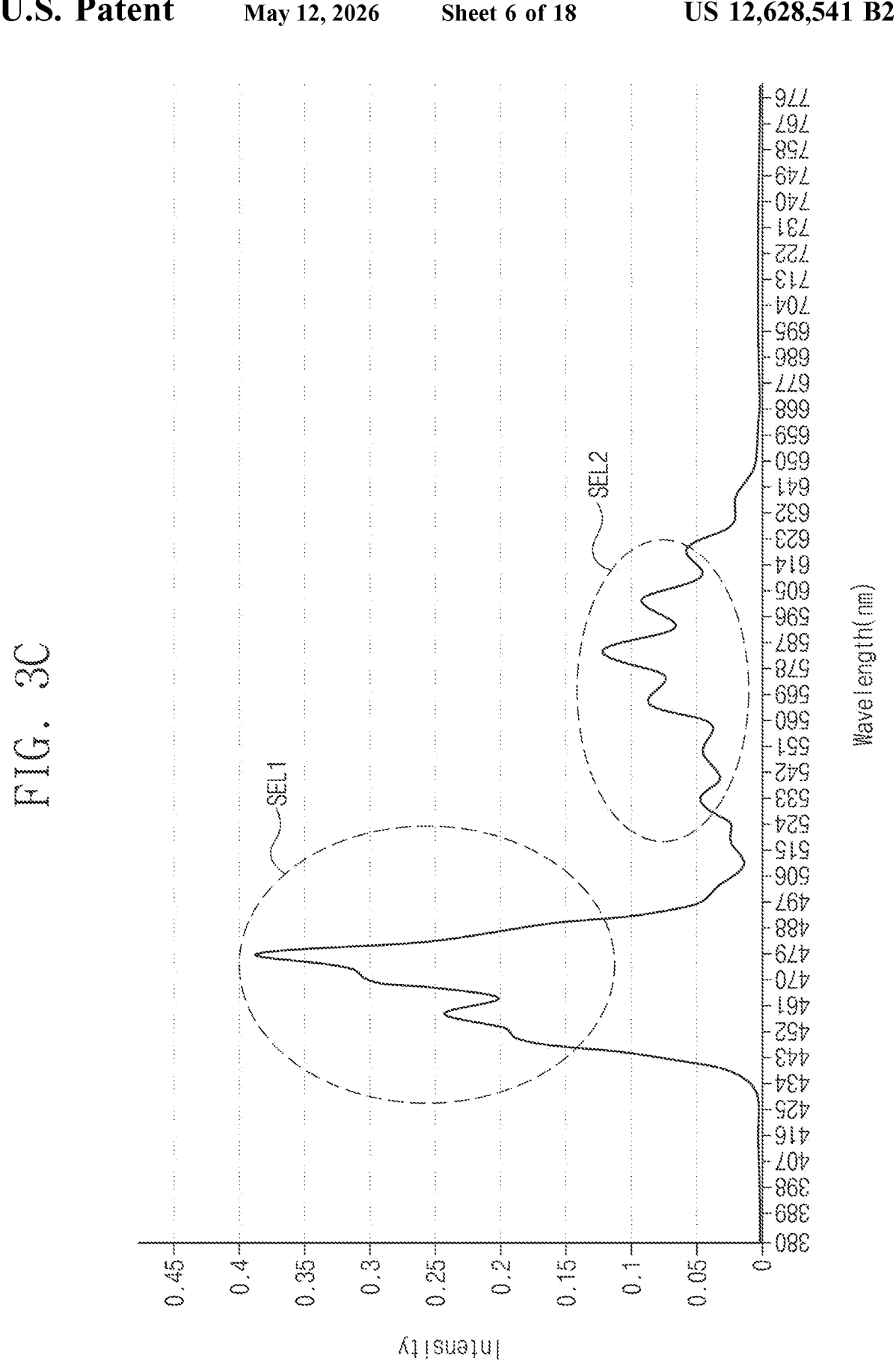
FIG. 3C is a graph showing a spectrum of source light generated from a light emitting element shown in FIG. 3B.
Figure 3D:
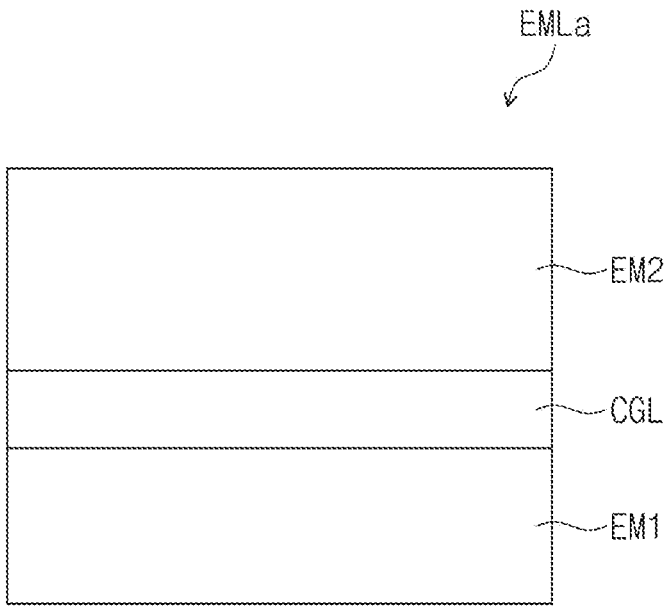
FIGS. 3D and 3E illustrate cross-sectional views showing an emission structure included in a light emitting element shown in FIG. 3B.
Figure 3D:
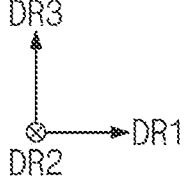
Figure 3E:
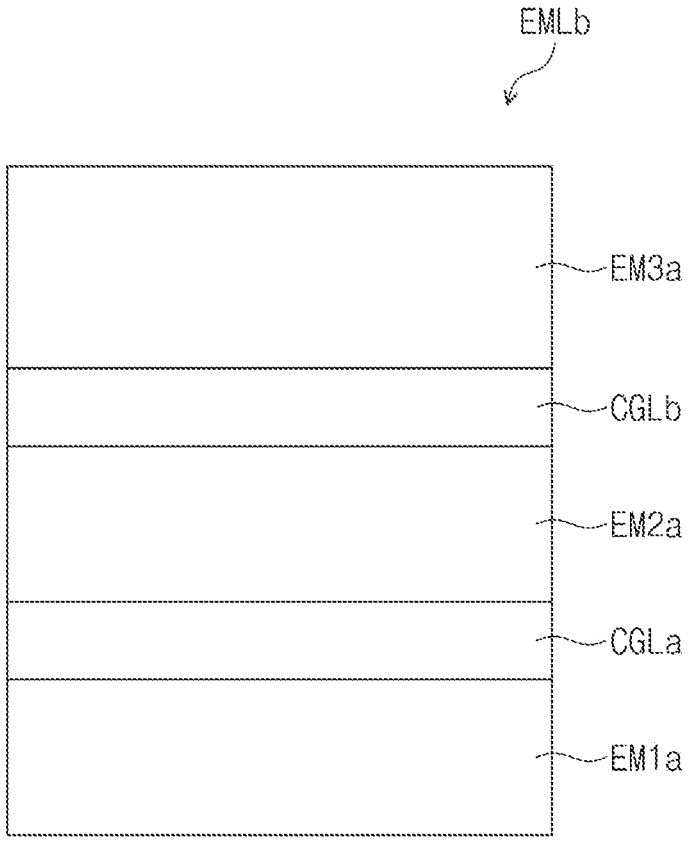
Figure 3E:
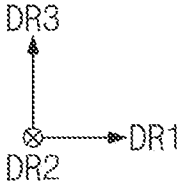

FIG. 3A illustrates an enlarged plane view showing the display region DA according to an embodiment of the present disclosure. FIG. 3B illustrates a cross-sectional view taken along the line I-I' in FIG. 3A. FIG. 3C is a graph showing a spectrum of source light generated from the light emitting element OLED shown in FIG. 3B. FIGS. 3D and 3E illustrate cross-sectional views respectively showing organic emission structures EMLa and EMLb included in the light emitting element OLED shown in in FIG. 3B.

As shown in FIG. 3A, the unit pixels PXU may be arranged in the first direction DR1 and the second direction DR2. In the illustrated embodiment, the unit pixel PXU may include a first pixel, a second pixel, and a third pixel that emit light having different colors from each other. The first pixel, the second pixel, and the third pixel may output red light, green light, and blue light, respectively. In FIG. 3A, a first pixel region PXA-R, a second pixel region PXA-G, and a third pixel region PXA-B are illustrated to represent the first pixel, the second pixel, and the third pixel, respectively. The first pixel region PXA-R may be a section (or area) at where light generated from the first pixel is emitted, the second pixel region PXA-G may be a section (or area) at where light generated from the second pixel is emitted, and the third pixel region PXA-B may be a section (or area) at where light generated from the third pixel is emitted.

A peripheral region NPXA may be disposed between the first pixel region PXA-R, the second pixel region PXA-G, and the third pixel region PXA-B. The peripheral region NPXA may establish boundaries of the first, second, and third pixel regions PXA-R, PXA-G, and PXA-B and may prevent color mixing between the first, second, and third pixel regions PXA-R, PXA-G, and PXA-B.

Referring to FIG. 3A, the first pixel region PXA-R and the third pixel region PXA-B may be disposed in the same row, and the second pixel region PXA-G may be disposed in a different row from that of the first pixel region PXA-R and the third pixel region PXA-B. The second pixel region PXA-G may have a largest area, and the third pixel region PXA-B may have a smallest area, but the present disclosure is not necessarily limited thereto. In the illustrated embodiment, the first pixel region PXA-R, the second pixel region PXA-G, and the third pixel region PXA-B are illustrated as having square shapes, but the present disclosure is not necessarily limited thereto.

FIG. 3B shows, by way of example, a cross-sectional view of the second pixel region PXA-G and the first transistor T1. A stack structure of each of the first and third pixel regions PXA-R and the PXA-B may be similar to that of the second pixel region PXA-G.

The display panel 100 may include a first base layer BS1, a driving circuit layer CCL, a light emitting element layer EL, and a thin encapsulation layer TFE. The driving circuit layer CCL may be disposed on the first base layer BS1. The driving circuit layer CCL may include a plurality of dielectric layers, a plurality of conductive layers, and a semiconductor layer. The light emitting element layer EL may be disposed on the driving circuit layer CCL. The thin encapsulation layer TFE may be disposed on and may encapsulate the light emitting element layer EL.

The first base layer BS1 may include glass or a synthetic resin layer. The synthetic resin layer may include a thermosetting resin. For example, the synthetic resin layer may be a polyimide-based resin layer, but the material of the synthetic resin layer is not limited. The synthetic resin layer may include at least one selected from acryl-based resin, methacrylate-based resin, polyisoprene, vinyl-based resin, epoxy-based resin, urethane-based resin, cellulose-based resin, siloxane-based resin, polyamide-based resin, and perylene-based resin. In other embodiments, the first base layer BS1 may include a glass substrate, a metal substrate, or an organic/inorganic composite substrate.

A light-shield pattern BML may be disposed on the first base layer BS1. The light-shield pattern BML may include metal. A signal line may be located at the same level as that of the light-shield pattern BML. The first base layer BS1 may be provided thereon with a first dielectric layer 10 that covers the light-shield pattern BML. A semiconductor pattern may be disposed on the first dielectric layer 10 to overlap the light-shield pattern BML. The semiconductor pattern may have different electrical properties based on whether it (or a portion thereof) is doped or not. The semiconductor pattern may include a first region having high conductivity and a second region having low conductivity. The first region may be doped with n-type or p-type impurities. A p-type transistor may include a doped region implanted with p-type impurities, and an n-type transistor may include a doped region implanted with n-type impurities. The second region may be an undoped region or may be a doped region implanted with impurities at a concentration is less than that of impurities doped in the first region.

The semiconductor pattern may have a source region S1, a channel region (or active region) A1, and a drain region D1. A second dielectric layer 20 may be disposed on the first dielectric layer 10. The second dielectric layer 20 may be provided therein with contact holes (e.g., contact openings) CNT1 that are defined to expose the source region S1 and the drain region D1. The first dielectric layer 10 and the second dielectric layer 20 may be inorganic layers.

Connection electrodes CNE1 and CNE2 may be disposed on the second dielectric layer 20. A first connection electrode CNE1 may electrically connect the source region S1 of the first transistor T1 to the drain D3 of the third transistor T3 shown in, for example, FIG. 2. A second connection electrode CNE2 may electrically connect the drain region D1 of the first transistor T1 to a signal line that receives the first voltage ELVDD shown in, for example, FIG. 2. The gate G1 of the first transistor T1 may be located at the same level (e.g., on the same layer) as that of the connection electrodes CNE1 and CNE2. The gate G1 of the first transistor T1 may overlap the channel region A1.

A third dielectric layer 30 may be disposed on the second dielectric layer 20. A third connection electrode CNE3 may be disposed on the third dielectric layer 30. The third connection electrode CNE3 may be connected to the first connection electrode CNE1 through a contact hole (e.g., a contact opening) CNT2 that penetrates the third dielectric layer 30. A fourth dielectric layer 40 may be disposed on the third dielectric layer 30. An anode AE2 may be disposed on the fourth dielectric layer 40. The anode AE2 may be connected to the third connection electrode CNE3 through a contact hole (e.g., a contact opening) CNT3 that penetrates the fourth dielectric layer 40. The third dielectric layer 30 and the fourth dielectric layer 40 may be organic layers. The first pixel region PXA-R and the third pixel region PXR-B may have respective anodes AE1 and AE3 that are located at the same level as that of the anode AE2 of the second pixel region PXA-G.

A light emitting element OLED and a pixel definition layer PDL may be disposed on the fourth dielectric layer 40. An opening OP in the pixel definition layer PDL may expose at least a portion of the anode AE2. Emission regions EA1, EA2, and EA3 may be defined to allow the openings OP in the pixel definition layer PDL to correspond to anodes AE1, AE2, and AE3 of the first pixel region PXA-R, the second pixel region PXA-G, and the third pixel region PXA-B. A non-emission region NEA may refer to a section between emission regions EA1, EA2, and EA3 and/or to a section where the pixel definition layer PDL is disposed.

A hole control layer HCL may be disposed in common on the emission regions EA1, EA2, and EA3 and the non-emission region NEA. A common layer, such as the hole control layer HCL, may be disposed to overlap a plurality of unit pixels PXU on the display region DA shown in, for example, FIG. 3A. The hole control layer HCL may include a hole transport layer and a hole injection layer.

An emission structure EML may be disposed on the hole control layer HCL. The emission structure EML may be disposed in common on the emission regions EA1, EA2, and EA3 and the non-emission region NEA. The emission structure EML may generate source light.

An electron control layer ECL may be disposed on the emission structure EML. The electron control layer ECL may include an electron transport layer and an electron injection layer. A cathode CE may be disposed on the electron control layer ECL. The thin encapsulation layer TFE may be disposed on the cathode CE. The thin encapsulation layer TFE may be disposed in common on a plurality of unit pixels PXU on the display region DA shown in, for example, FIG. 3A. In the illustrated embodiment, the thin encapsulation layer TFE directly covers the cathode CE.

The thin encapsulation layer TFE may include at least an inorganic or organic layer. The thin encapsulation layer TFE may include a first inorganic encapsulation layer ITL1, an organic encapsulation layer OTL, and a second inorganic encapsulation layer ITL2 that are sequentially stacked. The organic encapsulation layer OTL may be disposed between the first inorganic encapsulation layer ITL1 and the second inorganic encapsulation layer ITL2. The first inorganic encapsulation layer ITL1 and the second inorganic encapsulation layer ITL2 may protect the light emitting element layer EL against moisture and oxygen, and the organic encapsulation layer OTL may protect the light emitting element layer EL against foreign substances, such as dust particles. The first inorganic encapsulation layer ITL1 and the second inorganic encapsulation layer ITL2 may include at least one selected from silicon nitride, silicon oxynitride, silicon oxide, titanium oxide, and aluminum oxide. The organic encapsulation layer OTL may include a polymer, for example, an acrylic-based organic layer. This, however, is merely an example, and the organic encapsulation layer OTL is not limited thereto.

FIG. 3B shows, by way of example, that the thin encapsulation layer TFE includes two inorganic layers and one organic layer, but the present disclosure is not limited thereto. For example, the thin encapsulation layer TFE may include three inorganic layers and two organic layers, and in such an embodiment, the thin encapsulation layer TFE may have a structure in which one or more inorganic layers are stacked alternately with one or more organic layers. The display panel 100 may further include a refractive index control layer on the thin encapsulation layer TFE to increase light emission efficiency.

In the illustrated embodiment, the emission structure EML may generate first color source light (or first source light) and second color source light (or second source light). FIG. 3C shows a spectrum of source light generated by the light emitting element OLED depicted in, for example, FIG. 3B. The source light may include first source light SEL1 and second source light SEL2. In the illustrated embodiment, the first source light SEL1 may be blue light having a wavelength in a range of about 434 nm to about 506 nm. The second source light SEL2 may be green light having a wavelength in a range of about 524 nm to about 605 nm. The first source light SEL1 may have intensity greater than that of the second source light SEL2. In an embodiment of the present disclosure, the first source light SEL1 may be one of green light, blue light, and red light, and the second source light SEL2 may be another of green light, blue light, and red light.

The emission structure EML may include at least one emission layer. The emission layer may include a light emitting material that generates the first color source light and a light emitting material that generates the second color source light. The emission structure EML may include an emission layer that generate the first color source light and an emission layer that generates the second color source light. The emission layer may include an organic light emitting material and an inorganic light emitting material.

As shown in FIG. 3D, an emission structure EMLa may include a first emission layer EM1, a charge generation layer CGL, and a second emission layer EM2 that are sequentially stacked along the third direction DR3. One of the first and second emission layers EM1 and EM2 may emit light whose color is different from that of light emitted from the other of the first and second emission layers EM1 and EM2. For example, the first emission layer EM1 may emit blue light, and the second emission layer EM2 may emit green light.

The charge generation layer CGL may be disposed between the first emission layer EM1 and the second emission layer EM2. The charge generation layer CGL may provide each of the first and second emission layers EM1 and EM2 with electrons or holes to increase light emission efficiency.

As shown in FIG. 3E, an emission structure EMLb may include a first emission layer EM1a, a first charge generation layer CGLa, a second emission layer EM2a, a second charge generation layer CGLb, and a third emission layer EM3a.

One of the first, second, and third emission layers EM1*a*, EM2*a*, and EM3*a* may emit light whose color is different from that of light emitted from each of the others of the first, second, and third emission layers EM1*a*, EM2*a*, and EM3*a*. For example, the first emission layer EM1*a* may emit light whose color is the same as that of light emitted from the third emission layer EM3*a*, and the second emission layer EM2*a* may emit light whose color is different from that of light emitted from the first emission layer EM1*a*. For example, the first and third emission layers EM1*a* and EM3*a* may emit blue light, and the second emission layer EM2*a* may emit green light.

The first charge generation layer CGLa may be disposed between the first emission layer EM1*a* and the second emission layer EM2*a*. The second charge generation layer CGLb may be disposed between the second emission layer EM2*a* and the third emission layer EM3*a*. The first charge generation layer CGLa may provide each of the first and second emission layers EM1*a* and EM2*a* with electrons or holes to increase light emission efficiency. In addition, the second charge generation layer CGLb may provide each of the second and third emission layers EM2*a* and EM3*a* with electrons or holes to increase light emission efficiency.

The light conversion panel 200 will be described with reference to FIG. 3B. A synthetic resin material SRM may be disposed in a cell gap GP between the light conversion panel 200 and the display panel 100. The light conversion panel 200 and the display panel 100 may be coupled by (or across) the synthetic resin material SRM, and thus, the cell gap GP may have the synthetic resin material SRM positioned therein.

The light conversion panel 200 may include a second base layer BS2, a color filter CF-R, CR-G, and RG-B disposed on a bottom surface of the second base layer BS2, a light control pattern CCF-R, CCF-G, and SP, a partition wall BW, and a plurality of dielectric layers 200-1, 200-2, and 200-3. The second base layer BS2 may include glass or a synthetic resin layer. The synthetic resin layer may include a thermosetting resin. For example, the synthetic resin layer may be a polyimide-based resin layer, but the material of the synthetic resin layer is not limited.

The color filter CF-R, CF-G, and CF-B may include a first color filter CF-R, a second color filter CF-G, and a third color filter CF-B. The first color filter CF-R may be disposed to overlap a first emission region EA1, the second color filter CF-G may be disposed to overlap a second emission region EA2, and the third color filter CF-B may be disposed to overlap a third emission region EA3. The first color filter CF-R may be transparent to third color light, which will be discussed below, and may be opaque to the first color light and the second color light, which are discussed above. The second color filter CF-G may be transparent to the second color light (or the second source light (see, e.g., SEL2 in FIG. 3C)) and may be opaque to the first color light (or the first source light (see, e.g., SEL1 in FIG. 3C)) and the third color light. The third color filter CF-B may be transparent to the first color light (or the first source light SEL1) and may be opaque to the second color light (or the second source light SEL2) and the third color light. The second color filter CF-G may be transparent to the second source light SEL2, for example, only to a partial wavelength (or central wavelength) of the second source light SEL2 to increase color purity. For the same reason, the third color filter CF-B may be transparent only to a partial wavelength (or central wavelength) of the first source light SEL1.

The first color filter CF-R, the second color filter CF-G, and the third color filter CF-B may define the first pixel region PXA-R, the second pixel region PXA-G, the third pixel region PXA-B, and the peripheral region NPXA. The peripheral region NPXA may be defined as a section where two or more of the first, second, and third color filters CF-R, CR-G, and CF-B are disposed to overlap each other. Each of the first pixel region PXA-R, the second pixel region PXA-G, the third pixel region PXA-B may include only a corresponding one of the first color filter CF-R, the second color filter CF-G, and the third color filter CF-B. When a black matrix is included, the peripheral region NPXA may indicate a section (or area) where the black matrix is located.

A first dielectric layer 200-1 may be disposed below and cover the first color filter CF-R, the second color filter CF-G, and the third color filter CF-B. A second dielectric layer 200-2 may cover the first dielectric layer 200-1 and may provide a planarized surface on a lower side thereof. The first dielectric layer 200-1 may be an inorganic layer, and the second dielectric layer 200-2 may be an organic layer.

The partition wall BW may be disposed below the second dielectric layer 200-2. When viewed in a plane, the partition wall BW may overlap the peripheral region NPXA. The partition wall BW may have openings BW-OP defined therein. The openings BW-OP may correspond to the first pixel region PXA-R, the second pixel region PXA-G, and the third pixel region PXA-B, and to the first emission region EA1, the second emission region EA2, and the third emission region EA3. The language "correspond" as used herein refers to two components overlapping each other and is not limited to the same area. FIG. 3B shows a simplified illustration of the partition wall BW, and the partition wall BW will be further discussed, in detail, with reference to FIGS. 5A and 5B.

The partition wall BW may include a material whose transmittance is equal to or less than a reference value. For example, the partition wall BW may include a light-shielding material, for example, a black coloring agent. The partition wall BW may include a black dye or pigment mixed in a base resin. For example, the partition wall BW may include at least one selected from propylene glycol methyl ether acetate, 3-methoxy-n-butyl acetate, acrylate monomer, acrylic monomer, organic pigments, and acrylate ester.

The light control pattern CCF-R, CCF-G, and SP may include a first light conversion pattern CCF-R, a second light conversion pattern CCF-G, and a transparent resin pattern SP that are correspondingly disposed in the openings BW-OP. The first light conversion pattern CCF-R, the second light conversion pattern CCF-G, and the transparent resin pattern SP may be disposed to respectively correspond to the first pixel region PXA-R, the second pixel region PXA-G, and the third pixel region PXA-B.

The first light conversion pattern CCF-R may convert the first source light (see, e.g., SEL1 in FIG. 3C) into the third color light. The third color light may be red light. The second light conversion pattern CCF-G may convert the first source light SEL1 into the second color light. The second color light may be green light. The second color light converted in the second light conversion pattern CCF-G may be described as a light having the same color as that of the second source light SEL2 discussed with reference to FIG. 3C but may have a spectrum different from that of the second source light SEL2 discussed with reference to FIG. 3C.

The transparent resin pattern SP may be transparent to the first source light SEL1 and the second source light SEL2 without converting the first source light SEL1 and the second source light SEL2 into different color light. The transparent resin pattern SP may include a transparent base resin. The transparent resin pattern SP may further include scattering particles mixed in the base resin. The scattering particles may scatter the first source light SEL1 that passes through the transparent resin pattern SP to increase a viewing angle of the third pixel region PXA-B.

An inkjet process may be employed to form each of the first light conversion pattern CCF-R, the second light conversion pattern CCF-G, and the transparent resin pattern SP. The first light conversion pattern CCF-R, the second light conversion pattern CCF-G, and the transparent resin pattern SP may be formed by correspondingly providing compositions to spaces (or voids), such as a plurality of openings BW-OP, defined by the partition wall BW.

The first light conversion pattern CCF-R and the second light conversion pattern CCF-G may include a quantum dot. Each of the first light conversion pattern CCF-R and the second light conversion pattern CCF-G may include a base resin, a quantum dot, and a scattering particle. In an embodiment of the present disclosure, the scattering particle may be omitted.

The base resin may be a medium in which quantum dots or scattering particles are dispersed, and the medium may include various resin compositions that are commonly referred to as binders. The present disclosure, however, is not limited thereto, and in this description, any medium in which quantum dots can be dispersed may be referred to as the base resin irrespective of its name, additional other function, constituent material, and the like. The base resin may be a polymer resin. For example, the base resin may be an acrylic-based resin, a urethane-based resin, a silicon-based resin, or an epoxy-based resin. The base resin may be a transparent resin.

The scattering particle may be titanium oxide (e.g., $TiO_2$) or a silica-based nano particle. The scattering particle may scatter incident light to increase an amount of light that is outwardly emitted. In an embodiment of the present disclosure, no scattering particle may be included in at least one selected from the first light conversion pattern CCF-R and the second light conversion pattern CCF-G.

The quantum dot may be a particle that converts a wavelength of incident light. The quantum dot, which is a material having a crystal structure of several nanometers in size, may be formed of hundreds to thousands of atoms and may exhibit a quantum confinement effect in which an energy bandgap is increased due to a small size of the quantum dot. When the quantum dot is irradiated with light having a wavelength whose energy is greater than the bandgap, the quantum dot absorbs the light and transitions to an excited state and then falls back to a ground state while emitting light having a specific wavelength. The emitted light of the specific wavelength may have a value that corresponds to the bandgap. When the quantum dot is adjusted in size and composition, the quantum dot may control emission properties caused by the quantum confinement effect.

A core of the quantum dot may include one selected from II-VI group compounds, I-II-VI group compounds, II-IV-VI group compounds, I-II-IV-VI group compounds, III-VI group compounds, I-III-VI group compounds, III-V group compounds, III-II-V group compounds, II-IV-V group compounds, IV-VI group compounds, IV group elements, IV group compounds, and any combination thereof.

The II-VI group compound may include one or more of a binary compound selected from CdS, CdSe, CdTe, ZnS, ZnSe, ZnTe, ZnO, HgS, HgSe, HgTe, MgSe, MgS, and any mixture thereof; a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any mixture thereof; and a quaternary compound selected from CdZnSeS, CdZnSeTe, CdZnSTe, CdHgSeS, CdHgSeTe, CdHgSTe, HgZnSeS, HgZnSeTe, HgZnSTe, and any mixture thereof. The II-VI group compound may further include one or more of I group metal and IV group elements. The I-II-VI group compound may include one selected from CuSnS and CuZnS, and the II-IV-VI group compound may include ZnSnS. The I-II-IV-VI group compound may include a quaternary compound selected from $Cu_2ZnSnS_2$, $Cu_2ZnSnS_4$, $Cu_2ZnSnSe_4$, $Ag_2ZnSnS_2$, and any mixture thereof.

The III-VI group compound may include one of a binary compound, such as $In_2S_3$ or $In_2Se_3$; a ternary compound such as $InGaS_3$ or $InGaSe_3$; and any combination thereof.

The I-III-VI group compound may include one or more of a ternary compound selected from AgInS, $AgInS_2$, CuInS, $CuInS_2$, $AgGaS_2$, $CuGaS_2$ $CuGaO_2$, $AgGaO_2$, $AgAlO_2$, and any mixture thereof, and a quaternary compound, such as $AgInGaS_2$ or $CuInGaS_2$.

The III-V group compound may include one or more of a binary compound selected from GaN, GaP, GaAs, GaSb, AlN, AlP, AlAs, AlSb, InN, InP, InAs, InSb, and any mixture thereof; a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and any mixture thereof; and a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any mixture thereof. The III-V group compound may further include II group metal. For example, the III-II-V group compound may include InZnP.

The II-IV-V group compound may include a ternary compound selected from one of ZnSnP, $ZnSnP_2$, $ZnSnAs_2$, $ZnGeP_2$, $ZnGeAs_2$, $CdSnP_2$, $CdGeP_2$, and any mixture thereof.

The IV-VI group compound may include one or more of a binary compound selected from SnS, SnSe, SnTe, PbS, PbSe, PbTe, and any mixture thereof; a ternary compound selected from the SnSeS, SnSeTe, SnSTe, PbSeS, PbSeTe, PbSTe, SnPbS, SnPbSe, SnPbTe, and any mixture thereof; and a quaternary compound selected from SnPbSSe, SnPbSeTe, SnPbSTe, and any mixture thereof. The IV group element may include one of S1, Ge, and any mixture thereof. The IV group compound may include a binary compound selected from SiC, SiGe, and any mixture thereof.

One of the binary, ternary, and quaternary compounds may be present at a uniform concentration in a particle or may be present to have divided states at partially different concentrations in the same particle. In addition, the quantum dot may have a core/shell structure in which one quantum dot surrounds another quantum dot. An interface between the core and the shell may have a concentration gradient such that a concentration of an element present in the shell decreases along a direction toward a center of the core.

In some embodiments, the quantum dot may have a core-shell structure in which a shell encloses a core including nano-crystal as described above. The shell of the quantum dot may act as a protection layer that prevents or reduces chemical degeneration of the core to thereby maintain semiconductor properties and/or as a charging layer that provides the quantum dot with electrophoresis properties. The shell may be a single layer or may have a multiple layer structure. The shell of the quantum dot may be, for example, metal oxide, non-metal oxide, a semiconductor compound, or any combination thereof.

For example, the metal oxide or non-metal oxide may be one of a binary compound, such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and $NiO$, and a ternary compound, such as $MgAl_2O_4$, $CoFe_2O_4$, $NiFe_2O_4$, and $CoMn_2O_4$, but the present disclosure is not necessarily limited thereto.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof, but the present disclosure is not necessarily limited thereto.

The quantum dot may have a full width of half maximum (FWHM) of an emission wavelength spectrum within a range of about 45 nm or less, about 40 nm or less, or about 30 nm or less, and color purity and/or color reproduction may improve in these ranges. In addition, light released through such quantum dot may be emitted in all directions, which may result in increased viewing angle.

The quantum dot may have, but is not particularly limited to, any suitable shape commonly used in the art, for example, may have a shape of sphere, pyramid, multi-arm, cubic nano-particle, nano-tube, nano-wire, nano-fiber, or nano-plate particle.

The quantum dot may adjust a color of light emitted depending on a particle size thereof and may thus have various luminous colors such as blue, red, and green.

The third dielectric layer 200-3 may cover the partition wall BW, the first light conversion pattern CCF-R, the second light conversion pattern CCF-G, and the transparent resin pattern SP. For example, the third dielectric layer 200-3 may be an inorganic layer.

Figure 4A:
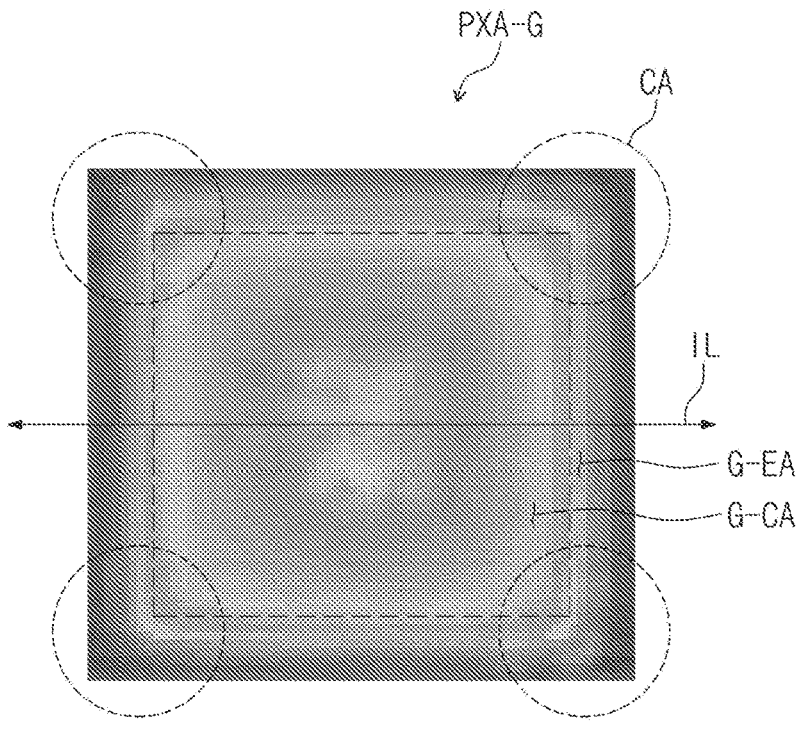
FIG. 4A is an image showing intensity of light provided from a typical pixel region.
Figure 4B:
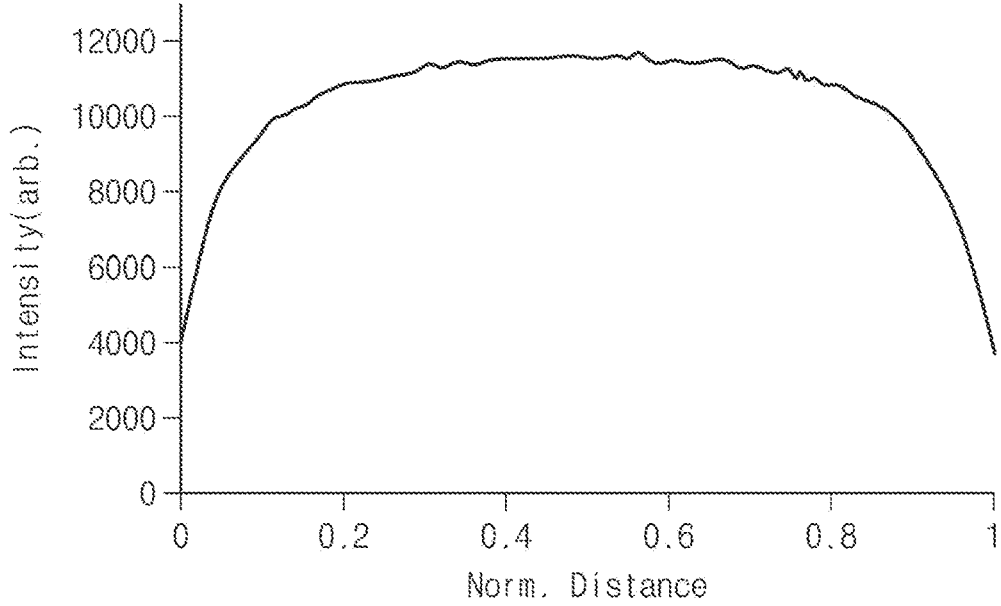
FIG. 4B is a graph showing intensity of light provided from a pixel region shown in FIG. 4A.

FIG. 4A is an image showing intensity of light provided from (e.g., emitted from) a pixel region PXA-G. FIG. 4B is a graph showing intensity of light provided from the pixel region PXA-G shown in FIG. 4A.

FIGS. 4A and 4B show an example of the second pixel region PXA-G. In FIG. 4B, the X axis denotes a normalized distance between opposite ends of the second pixel region PXA-G disposed along an imaginary line IL in FIG. 4A. In FIG. 4B, the Y axis indicates a relative value of intensity of light emitted from the second pixel region PXA-G, the intensity being measured outside the second pixel region PXA-G.

Referring to FIGS. 4A and 4B, a high intensity was measured from light emitted from a central zone G-CA of the second pixel region PXA-G while light emitted from an edge zone G-EA of the second pixel region PXA-G has intensity less than that of light emitted from the central zone G-CA.

The reason thereof will be described below with reference to FIGS. 3B and 3C. It is assumed that light emission efficiency of the second source light SEL2 is the same regardless of zones of (or areas of) the second pixel region PXA-G. Light conversion efficiency of the first source light SEL1 due to the second light conversion pattern CCF-G may vary depending on zones of the second pixel region PXA-G, and light emission efficiency of the converted second color light may vary depending on zones of the second pixel region PXA-G.

A large amount of the first source light SEL1 may be provided at (or from) the central zone G-CA of the second light conversion pattern CCF-G. Light reflected without being converted by quantum dots may be more concentrated at the central zone G-CA of the second light conversion pattern CCF-G, and thus, a large amount of the first source light SEL1 may be provided to quantum dots disposed at the central zone G-CA of the second light conversion pattern CCF-G. Most of the light converted at the central zone G-CA of the second light conversion pattern CCF-G may be outwardly emitted, but a portion of light converted at the edge zone G-EA of the second light conversion pattern CCF-G may be absorbed by the first color filter CF-R or the third color filter CF-B disposed on the peripheral region NPXA. Because light converted at the second light conversion pattern CCF-G is spread in accordance with Lambertian emission, an amount of outwardly emitted light may be limited and a significant amount of light may be absorbed by the first color filter CF-R or the third color filter CF-B.

FIG. 4A shows four corner areas CA. The corner areas CA may be corner areas of the second pixel region PXA-G. In addition, the corner areas CA may be corner areas of a section that corresponds to that inside the partition wall (see, e.g., BW in FIG. 3B). At the edge zone G-EA of the second pixel region PXA-G, the corner area CA may have a minimum (or lowest) intensity of emitted light. This phenomenon may be caused by the fact that the corner area CA is disposed farthest away from a center of the second pixel region PXA-G.

Figure 5A:
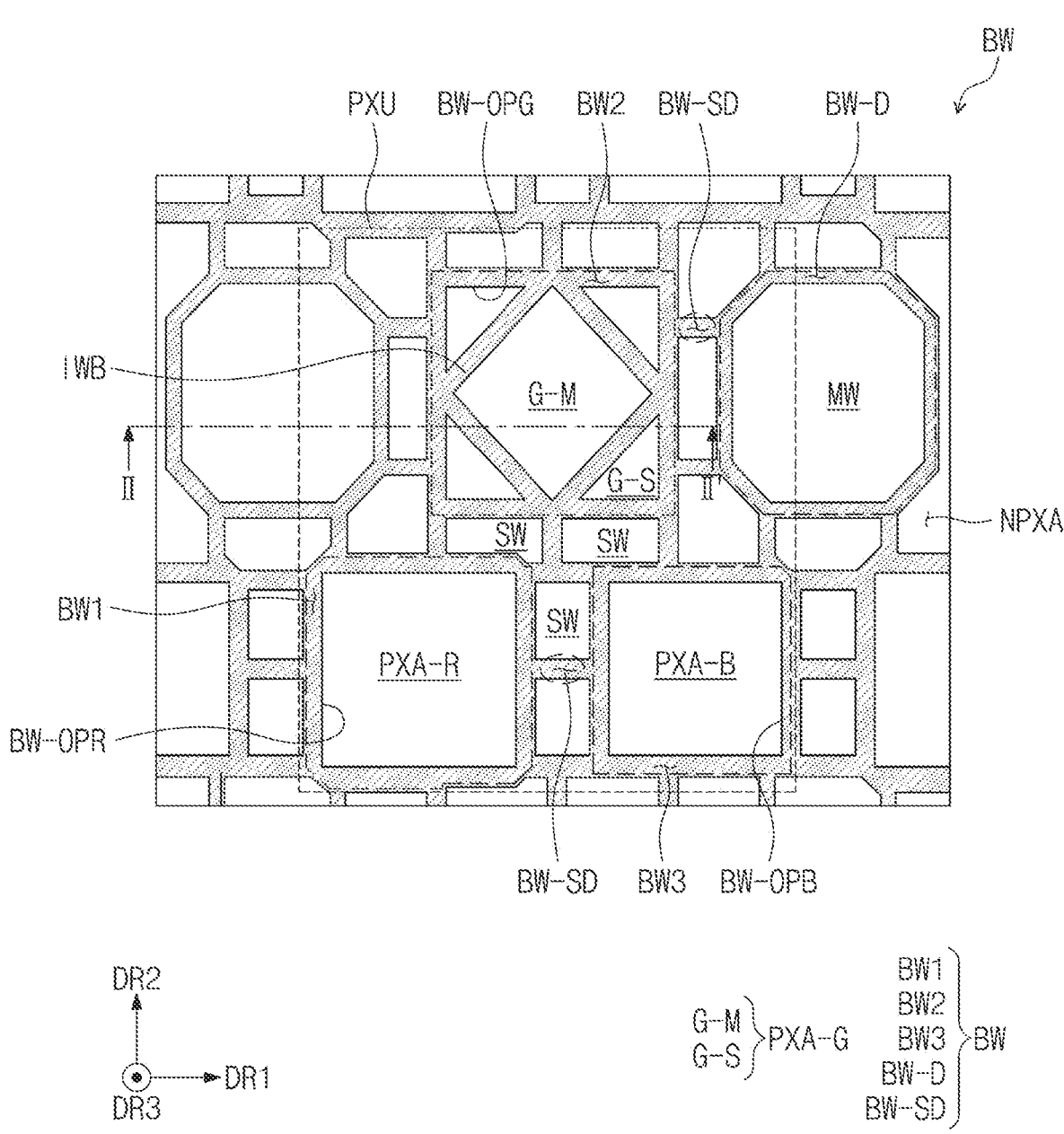
FIG. 5A illustrates a plane view showing a partition wall according to an embodiment of the present disclosure.
Figure 5B:
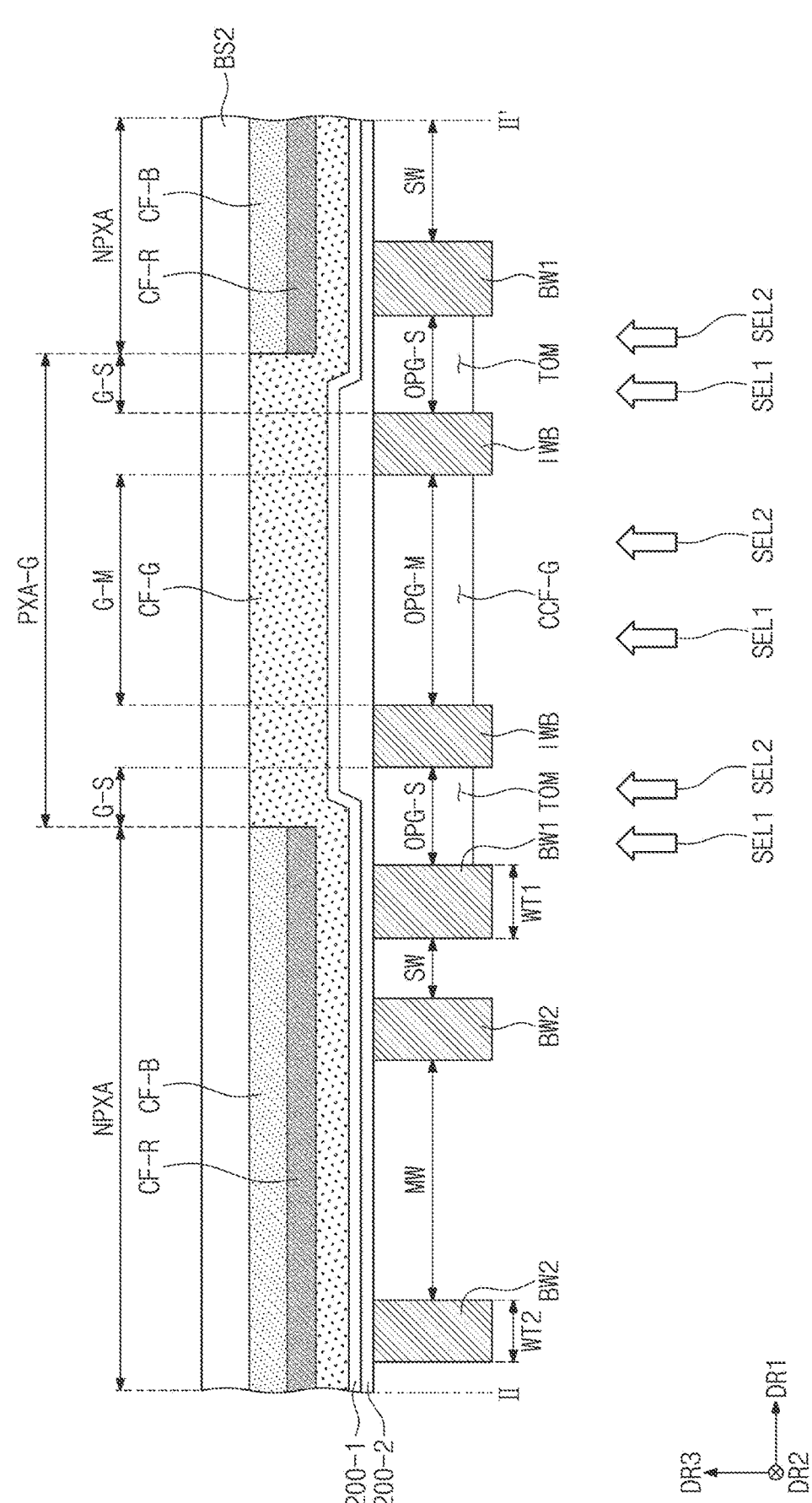
FIG. 5B illustrates a cross-sectional view showing a light conversion panel taken along the line II-II' in FIG. 5A.
Figure 5C:
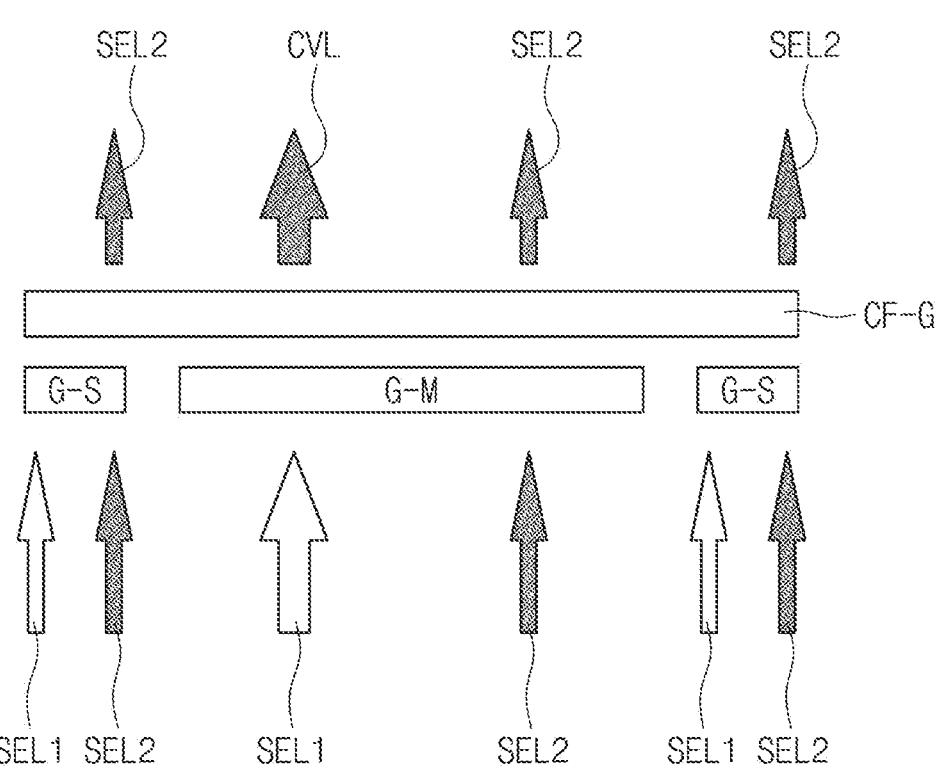
FIG. 5C illustrates a cross-sectional view showing an optical path of a display device according to an embodiment of the present disclosure.

FIG. 5A illustrates a plane view showing the partition wall BW according to an embodiment of the present disclosure. FIG. 5B illustrates a cross-sectional view showing the light conversion panel 200 taken along the line II-II' in FIG. 5A. FIG. 5C illustrates a cross-sectional view showing an optical path of a display device according to an embodiment of the present disclosure.

Referring to FIG. 5A, the partition wall BW may include a first partition wall BW1 defining a first opening BW-OPR that corresponds to the first pixel region PXA-R, a second partition wall BW2 defining a second opening BW-OPG that corresponds to the second pixel region PXA-G, and a third partition wall BW3 defining a third opening BW-OPB that corresponds to the third pixel region PXA-B. The first, second, and third partition walls BW1, BW2, and BW3 may be spaced apart from each other.

The partition wall BW may include a sub-partition wall IWB that divides a region inside the second partition wall BW2 into a main region G-M and at least one sub region G-S. In the illustrated embodiment, the sub-partition wall IWB may define four sub regions G-S that correspond to the four corner areas CA shown in, for example, FIG. 4A. In the illustrated embodiment, the sub-partition wall IWB may have a rhombic shape. The main region G-M may have an area greater than that of the at least one sub region G-S. For example, the main region G-M may have an area greater than a total area of the sub regions G-S.

Referring to FIG. 5A, a main dummy partition wall BW-D may be disposed in the peripheral region NPXA. The main dummy partition wall BW-D may be disposed on opposite sides of the second partition wall BW2 in the first direction DR1. The main dummy partition wall BW-D may overlap a unit pixel adjacent to the unit pixel PXU shown in FIG. 5A. The main dummy partition wall BW-D may be disposed between the second partition wall BW2 of the unit pixel PXU shown in FIG. 5A and a second partition wall of the unit pixel adjacent to the unit pixel PXU shown in FIG. 5A.

The main dummy partition wall BW-D may define a main well MW. The main well MW may accommodate a liquid resin composition that is inaccurately provided (or deposited) in an inkjet fabrication process of forming the light control pattern CCF-R, CCF-G, and SP, discussed with reference to FIG. 3B. For example, the main well MW may accommodate a liquid resin composition that is not accurately provided to the second opening BW-OPG. If the main well MW is not formed by the main dummy partition wall BW-D, the main dummy partition wall BW-D may be formed of a dielectric pattern that occupies a certain area. A protrusion may be formed of a resin composition that is inaccurately provided on the dielectric pattern, and this situation may induce the occurrence of failure in a fabrication process for manufacturing a display device. The main well MW formed by the main dummy partition wall BW-D may suppress the occurrence of such a failure.

A sub-dummy partition wall BW-SD may be disposed on the peripheral region NPXA. The sub-dummy partition wall BW-SD may connect, to each other, neighboring ones of the first partition wall BW1, the second partition wall BW2, the third partition wall BW3, and the main dummy partition wall BW-D. The first partition wall BW1, the second partition wall BW2, the third partition wall BW3, and the main dummy partition wall BW-D may be connected by (or through) the sub-dummy partition wall BW-SD into a single unitary structure, with the result that a partition wall structure may have increased durability. A subordinate well SW may be defined by two sub-dummy partition walls BW-SD and neighboring ones of the first partition wall BW1, the second partition wall BW2, the third partition wall BW3, and the main dummy partition wall BW-D. The subordinate well SW may also accommodate a liquid resin composition that is inaccurately provided in a subsequent fabrication process.

Referring to FIG. 5B, the second light conversion pattern CCF-G may be disposed inside the main region G-M but not in the sub region G-S. The second light conversion pattern CCF-G may be disposed in a main opening OPG-M defined by the sub-partition wall IWB but not in a subordinate opening OPG-S defined by the second partition wall BW2 and the sub-partition wall IWB.

A transparent organic material TOM may be disposed in the subordinate opening OPG-S. The transparent organic material TOM may include a synthetic resin. The transparent organic material TOM may have scattering particles mixed therein. The transparent organic material TOM may be covered with the third dielectric layer 200-3 shown in FIG. 3B.

In an embodiment of the present disclosure, the third dielectric layer 200-3 shown in FIG. 3B may be formed earlier than (or before) the transparent organic material TOM, and in the sub region G-S, the third dielectric layer 200-3 may be in contact with an inner lateral surface of the second partition wall BW2, an inner lateral surface of the sub-partition wall IWB, and the second dielectric layer 200-2. The transparent organic material TOM may be disposed lower than (or below) the third dielectric layer 200-3. The transparent organic material TOM may be the synthetic resin material SRM discussed with reference to FIG. 3B.

Referring to FIGS. 5B and 5C, the first source light SEL1 and the second source light SEL2 may be respectively provided to the main region G-M and the sub region G-S. The first source light SEL1 provided to (e.g., incident to) the main region G-M may be converted by the second light conversion pattern CCF-G into second color light CVL and may then be outwardly provided (or emitted) after passing through the second color filter CF-G. A portion of the second source light SEL2 provided to the main region G-M may be reflected or extinguished, and another portion of the second source light SEL2 provided to the main region G-M may be provided to the second color filter CF-G after passing through the second light conversion pattern CCF-G. Then, a portion of the second source light SEL2 may be outwardly provided after passing through the second color filter CF-G at an upper side of the main region G-M.

Most of the first source light SEL1 provided to the sub region G-S may pass through the transparent organic material TOM and may enter the second color filter CF-G that overlaps the sub region G-S. Then, the first source light SEL1 may be blocked by the second color filter CF-G. Most of the second source light SEL2 provided to the sub region G-S may pass through the transparent organic material TOM and may enter the second color filter CF-G. Thereafter, the second source light SEL2 may be outwardly provided after passing through the second color filter CF-G on an upside of the sub region G-S.

The second source light SEL2 outwardly emitted through the sub region G-S may have intensity greater than that of the second color light that is outwardly emitted through the corner area CA discussed with reference to FIGS. 4A and 4B. As discussed with reference to FIGS. 4A and 4B, at the corner area CA, there may be low light conversion efficiency of light converted by the second light conversion pattern CCF-G and low light emission efficiency of the converted light. In addition, a significant amount of the second source light SEL2 provided to the corner area CA may be extinguished or reflected from the second light conversion pattern CCF-G. Because the sub region G-S allows for an outward emission of most of the second source light SEL2 provided to the sub region G-S, the sub region G-S may emit the second color light whose intensity is greater than that of the second color light that is emitted through the corner area CA discussed with reference to FIGS. 4A and 4B.

FIGS. 6A to 6D illustrate plane views showing the partition wall BW according to an embodiment of the present disclosure. In the embodiments described below, repetitive detailed descriptions of components that are the same or substantially similar to those discussed above with reference to FIGS. 5A to 5C will be avoided.

Figure 6A:
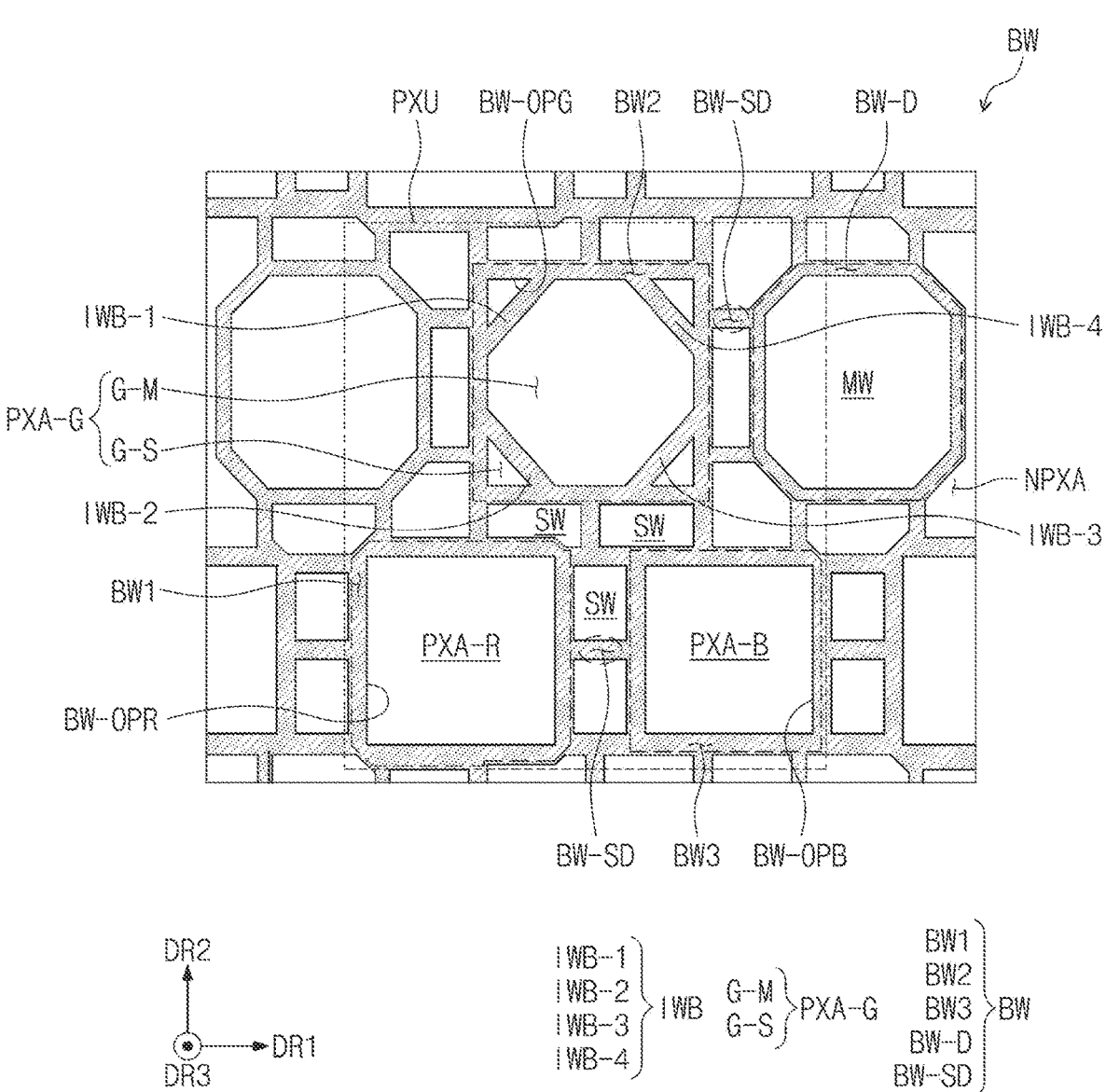
FIGS. 6A to 6D illustrate plane views showing a partition wall according to an embodiment of the present disclosure.

As shown in FIG. 6A, the sub-partition wall IWB may include a plurality of segments IWB-1, IWB-2, IWB-3, and IWB-4. First, second, third, and fourth segments IWB-1, IWB-2, IWB-3, and IWB-4 are illustrated by way of example. Each of the first, second, third, and fourth segments IWB-1, IWB-2, IWB-3, and IWB-4 may be disposed between portions of the second partition wall BW2.

The first, second, third, and fourth segments IWB-1, IWB-2, IWB-3, and IWB-4 may be disposed spaced apart from each other. The first, second, third, and fourth segments IWB-1, IWB-2, IWB-3, and IWB-4, together with the second partition wall BW2, may define four sub regions G-S that correspond to the corner areas CA shown in FIG. 4A.

Figure 6B:
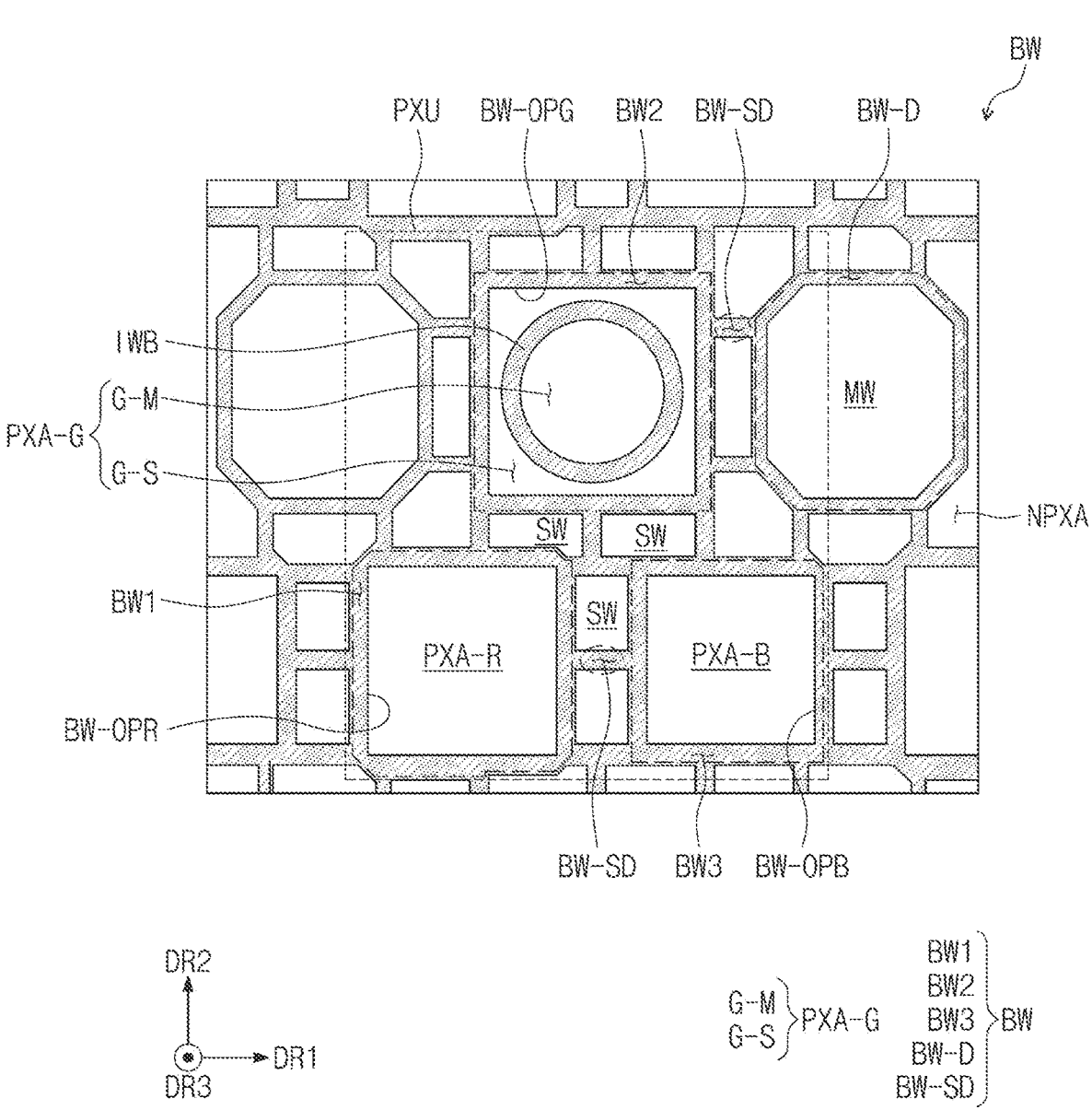
Figure 6C:
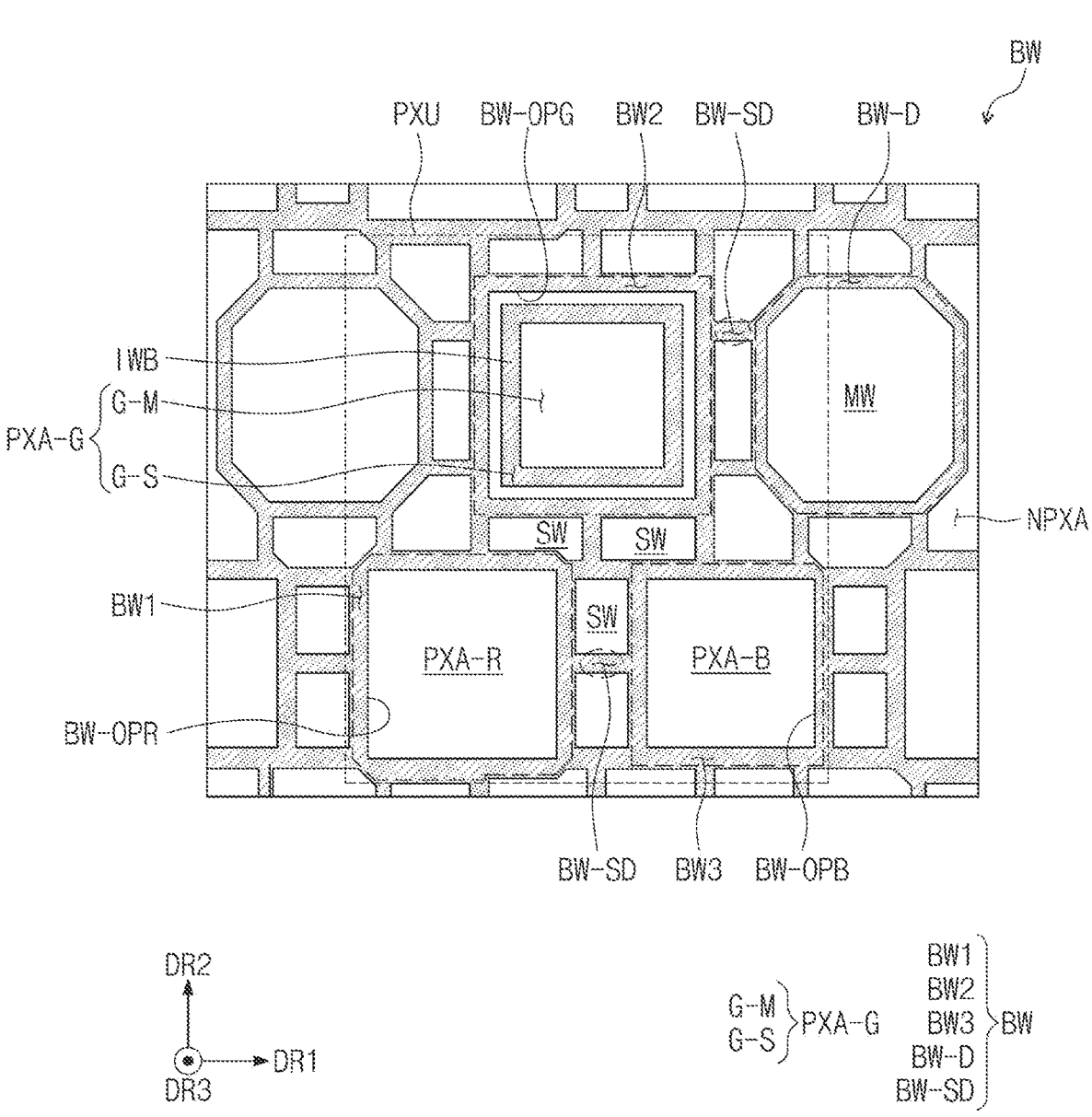

As shown in FIGS. 6B and 6C, the sub-partition wall IWB may have a closed linear shape and may be disposed spaced apart from the second partition wall BW2. The sub-partition wall IWB may have, but is not limited to, a circular or tetragonal shape. A region inside the sub-partition wall IWB may define the central zone G-CA of the second pixel region PXA-G discussed with reference to FIG. 4A, and a region between the sub-partition wall IWB and the second partition wall BW2 may define the edge zone G-EA of the second pixel region PXA-G discussed with reference to FIG. 4A. When viewed in a plane, the sub region G-S may completely surround (e.g., may extend around a periphery of) the main region G-M.

Figure 6D:
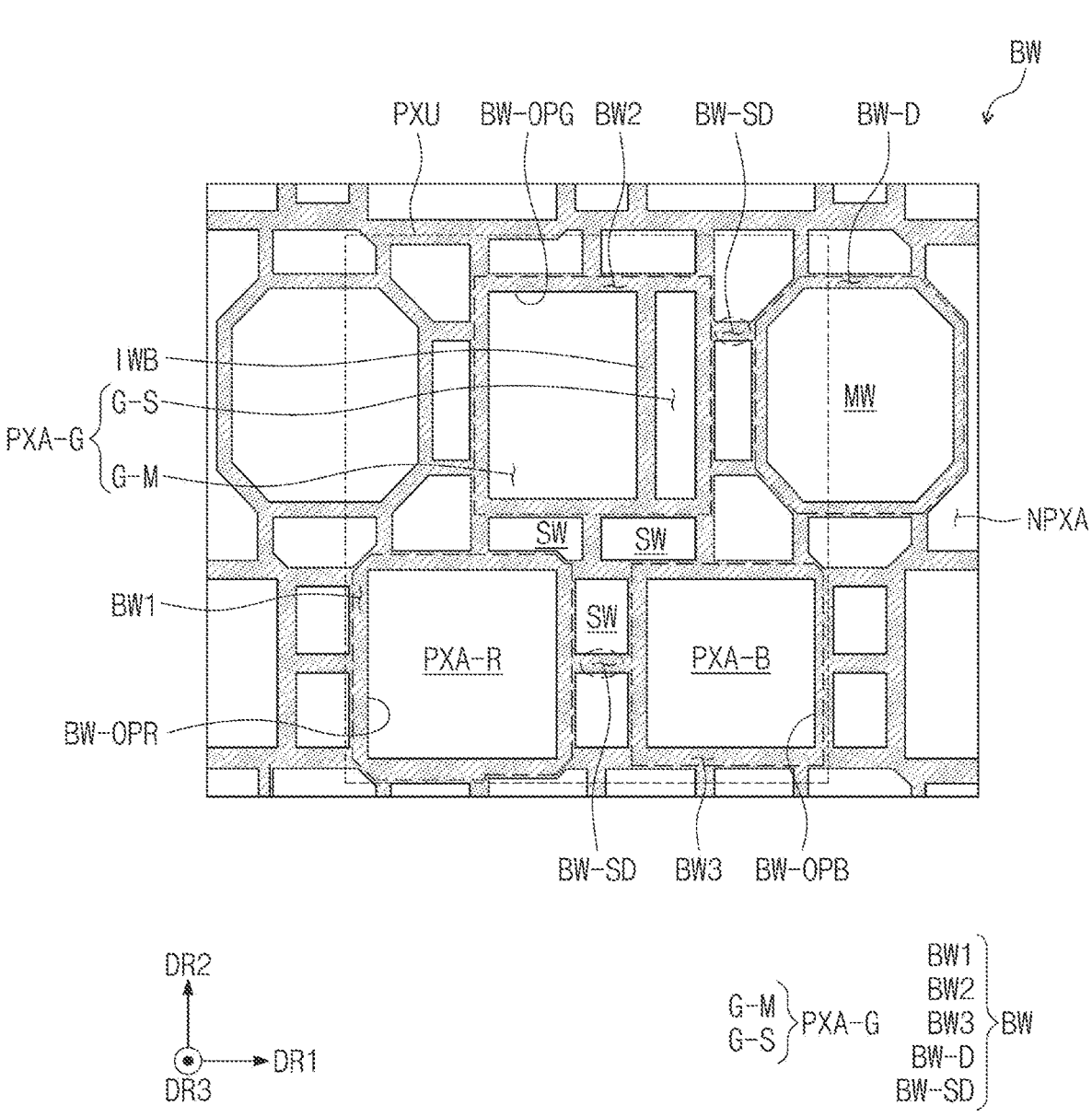

As shown in FIG. 6D, the sub-partition wall IWB may divide the second pixel region PXA-G into two sections. The main region G-M may correspond to a section having a large area, and the sub region G-S may correspond to a section having a smaller area.

Figure 7A:
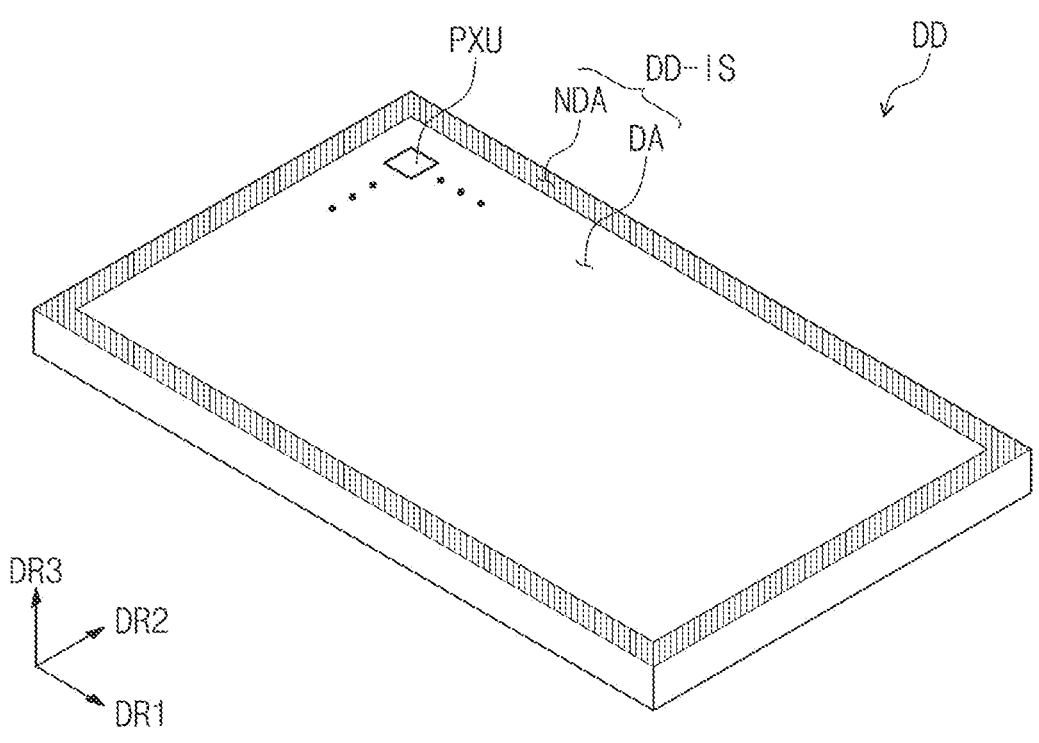
FIG. 7A illustrates a perspective view showing a display device according to an embodiment of the present disclosure.
Figure 7B:
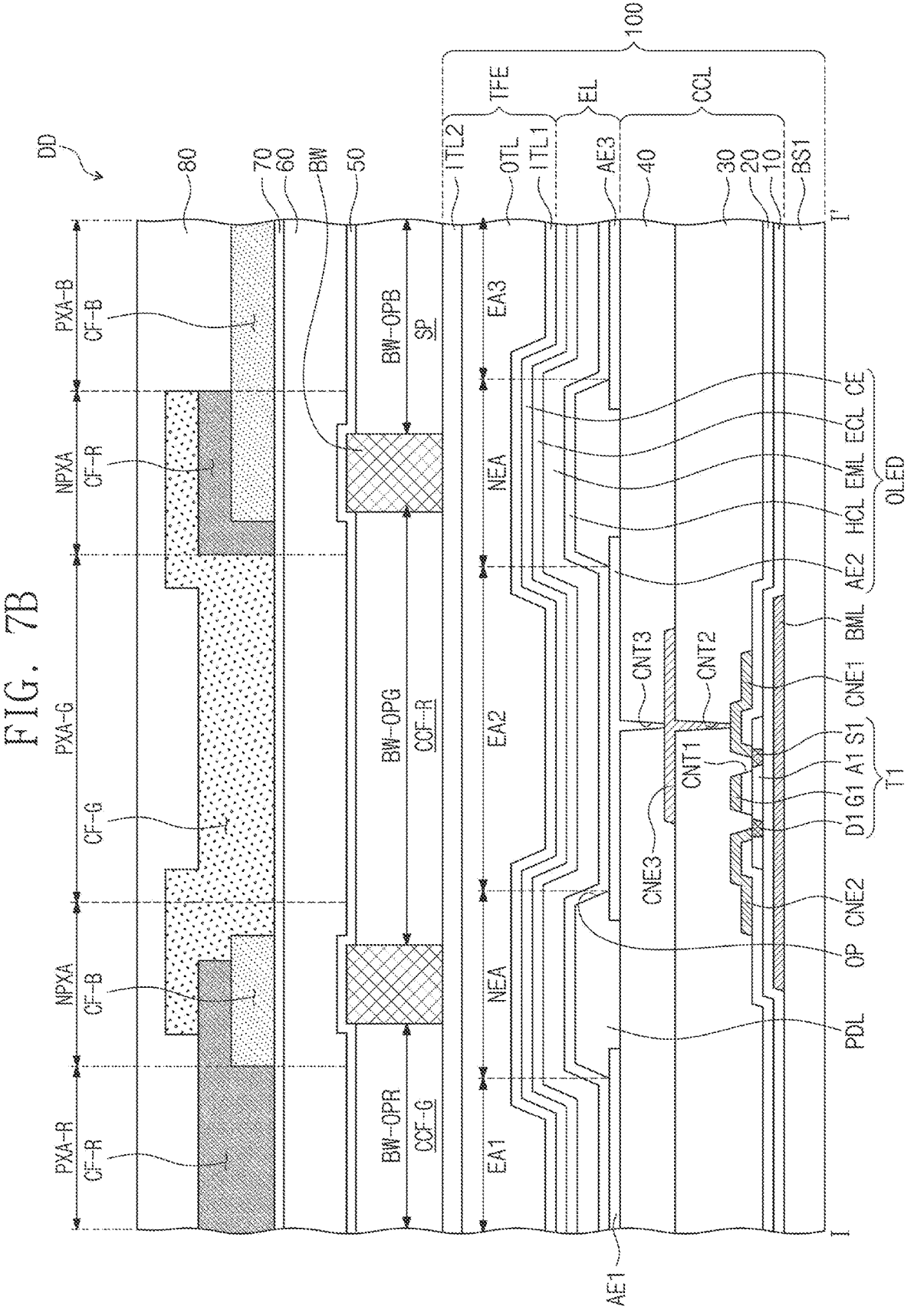
FIG. 7B illustrates a cross-sectional view showing a display device according to an embodiment of the present disclosure.

FIG. 7A illustrates a perspective view showing the display device DD according to an embodiment of the present disclosure. FIG. 7B illustrates a cross-sectional view showing the display device DD according to an embodiment of the present disclosure. In the description that follows, repetitive detailed descriptions of components that are the same or substantially similar as those discussed with reference to FIGS. 1A to 6D will be avoided.

Different from the display device DD discussed above with reference to FIGS. 1A to 6D, a display device DD according to the present embodiment may include a single base layer BS1 (e.g., the second base layer BS2 may be omitted). In a fabrication process, the display panel 100 may not be coupled to the light conversion panel 200; instead, structures may be sequentially formed on the base layer BS1.

Referring to FIGS. 7A and 7B, the display device DD may include the display panel 100 the same as that described with respect to FIG. 3B. The partition wall BW may be disposed on the thin encapsulation layer TFE. The first light conversion pattern CCF-R, the second light conversion pattern CCF-G, and the transparent resin pattern SP may be correspondingly disposed in the openings BW-OP in the partition wall BW. A fifth dielectric layer 50 may cover the partition wall BW, the first light conversion pattern CCF-R, the second light conversion pattern CCF-G, and the transparent resin pattern SP. For example, the fifth dielectric layer 50 may be an inorganic layer.

A sixth dielectric layer 60 may be disposed on the fifth dielectric layer 50. The sixth dielectric layer 60 may have a refractive index less than that of the fifth dielectric layer 50. The refractive index of the sixth dielectric layer 60 may be in a range from about 1.1 to about 1.5. The refractive index of the sixth dielectric layer 60 may be adjusted by changing proportions of hollow inorganic particles and/or voids included in the sixth dielectric layer 60. Source light and converted light may pass through the sixth dielectric layer 60 may relatively vertically.

A seventh dielectric layer 70 may be disposed on the sixth dielectric layer 60. The seventh dielectric layer 70 may be an inorganic layer that encapsulates a structure thereunder. In some embodiments, the seventh dielectric layer 70 may be omitted.

The seventh dielectric layer 70 may be provided thereon with the first color filter CF-R, the second color filter CF-G, and the third color filter CF-B. An eighth dielectric layer 80 may be disposed on and may cover the first color filter CF-R, the second color filter CF-G, and the third color filter CF-B, while providing a planarized surface. The eighth dielectric layer 80 may be an organic layer.

In an embodiment, a planar shape and arrangement of the partition wall BW may be the same as that of one of the partition walls BW discussed with reference to FIGS. 5A to 6D.

According to the description above, a main region may convert first color source light generated from a display panel into second color light. A sub region may be transparent to second color source light generated from the display panel. Therefore, intensity of the second color light that is emitted through a region that corresponds to a first partition wall may be increased.

Although the present disclosure has been described with reference to embodiments thereof, it will be understood by those of ordinary skill in the art that various changes in form and details may be made without departing from the spirit and scope of the present disclosure as set forth in the following claims and their equivalents. Thus, the technical scope of the present disclosure is not limited by the embodiments described above.

What is claimed is:

1. A display device comprising:
a display panel having a first emission region and a second emission region, each of the first emission region and the second emission region configured to emit a first source light having a first color and a second source light having a second color;
a first partition wall on the display panel, the first partition wall corresponding to the first emission region;
a sub-partition wall dividing a region inside the first partition wall into a main region and a sub region in a plane view;
a first light conversion pattern inside the main region, the first light conversion pattern configured to convert the first source light into a light having the second color; and
a first color filter on the first partition wall and the sub-partition wall, the first color filter being transparent to the second source light that passes through the sub region and to the converted light having the second color.

2. The display device of claim 1, wherein the sub region includes a corner area of the region inside the first partition wall.

3. The display device of claim 1, wherein the sub region completely surrounds the main region in the plane view.

4. The display device of claim 1, wherein an area of the main region is greater than an area of the sub region.

5. The display device of claim 1, wherein the first light conversion pattern comprises a base resin and a quantum dot mixed in the base resin.

6. The display device of claim 1, further comprising a transparent organic material inside the sub region.

7. The display device of claim 6, further comprising a scattering particle inside the sub region and mixed in the transparent organic material.

8. The display device of claim 1, wherein the first color is blue light, and
wherein the second color is green light.

9. The display device of claim 1, wherein the first color filter overlaps the main region and the sub region in the plane view.

10. The display device of claim 1, further comprising:
a second partition wall on the display panel, the second partition wall corresponding to the second emission region;
a second light conversion pattern inside the second partition wall, the second light conversion pattern configured to convert the first source light into a light having a third color; and
a second color filter on the second partition wall, the second color filter being opaque to the second source light that passes through the second light conversion pattern and transparent to the converted light having the third color.

11. The display device of claim 1, further comprising:
a second partition wall on the display panel, the second partition wall corresponding to the second emission region;
a transparent resin pattern inside the second partition wall, the transparent resin pattern being transparent to the first source light and the second source light; and

21 a second color filter on the second partition wall, the second color filter being opaque to the second source light that passes through the transparent resin pattern and transparent to the first source light that passes through the transparent resin pattern.

12. The display device of claim 11, wherein the transparent resin pattern comprises a base resin and a scattering particle mixed in the base resin.

13. The display device of claim 1, further comprising a base layer facing the display panel in a thickness direction of the display panel, wherein the first color filter is on a bottom surface of the base layer, and wherein the first partition wall and the sub-partition wall are on a bottom surface of the first color filter.

14. The display device of claim 1, wherein the display panel comprises:

a first anode in the first emission region;

a second anode in the second emission region and spaced apart from the first anode;

an emission structure on the first anode and the second anode, the emission structure extending through the first emission region and the second emission region; and a cathode on the emission structure, the cathode extending through the first emission region and the second emission region.

15. The display device of claim 14, wherein the emission structure comprises:

a first emission layer configured to generate the first source light;

a second emission layer configured to generate the second source light; and a charge generation layer between the first emission layer and the second emission layer.

16. The display device of claim 1, further comprising:

a main dummy partition wall defining a main well that does not overlap the first emission region and the second emission region in the plane view; and a sub-dummy partition wall extending between the main dummy partition wall and the first partition wall and defining a subordinate well.

17. A display device comprising:

a display panel comprising a first light emitting element and a second light emitting element, each of the first light emitting element and the second light emitting element configured to emit a first source light having a first color and a second source light having a second color; and

22 a light conversion panel spaced apart from the display panel in a thickness direction of the display panel, the light conversion panel comprising:

a base layer;

a partition wall on a bottom surface of the base layer, the partition wall corresponding to the first light emitting element;

a sub-partition wall dividing a region inside the partition wall into a main region and a sub region in a plane view;

a light conversion pattern inside the main region, the light conversion pattern configured to convert the first source light into a light having the second color; and a color filter between the light conversion pattern and the bottom surface of the base layer, the color filter being transparent to the second source light that passes through the sub region and to the converted light having the second color.

18. The display device of claim 17, further comprising a synthetic resin material between the display panel and the light conversion panel, wherein the synthetic resin material is inside the sub region.

19. A display device comprising:

a first light emitting element and a second light emitting element, each of the first light emitting element and the second light emitting element configured to emit a first source light having a first color and a second source light having a second color;

a thin encapsulation layer encapsulating the first light emitting element and the second light emitting element;

a partition wall on the thin encapsulation layer, the partition wall corresponding to the first light emitting element;

a sub-partition wall dividing a region inside the partition wall into a main region and sub region in a plane view;

a light conversion pattern inside the main region, the light conversion pattern configured to convert the first source light into a light having the second color; and a color filter on the partition wall and the sub-partition wall, the color filter being transparent to the second source light that passes through the sub region and to the converted light having the second color.

20. The display device of claim 19, further comprising:

a transparent organic material inside the sub region; and a scattering particle mixed in the transparent organic material.

* * * * *